(12) United States Patent
Willey et al.

(10) Patent No.: US 10,140,240 B2
(45) Date of Patent: Nov. 27, 2018

(54) CONTROL MESSAGING IN MULTISLOT LINK LAYER FLIT

(71) Applicant: Intel Corporation, Santa Clara, CA (US)

(72) Inventors: Jeff Willey, Timnath, CO (US); Robert G. Blankenship, Tacoma, WA (US); Jeffrey C. Swanson, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/393,518

(22) Filed: Dec. 29, 2016

(65) Prior Publication Data

US 2017/0308497 A1   Oct. 26, 2017

Related U.S. Application Data

(63) Continuation of application No. 14/583,554, filed on Dec. 26, 2014, now Pat. No. 9,740,654, which is a continuation of application No. 13/976,966, filed as application No. PCT/US2013/032601 on Mar. 15, 2013, now Pat. No. 9,507,746.

(60) Provisional application No. 61/717,091, filed on Oct. 22, 2012.

(51) Int. Cl.
*G06F 13/42* (2006.01)
*H03M 13/09* (2006.01)

(52) U.S. Cl.
CPC ...... *G06F 13/4221* (2013.01); *G06F 13/4265* (2013.01); *H03M 13/09* (2013.01)

(58) Field of Classification Search
CPC ............. G06F 13/4221; G06F 13/4265; G06F 13/4282; G06N 99/005; H03M 13/09
See application file for complete search history.

(56) References Cited

U.S. PATENT DOCUMENTS

| | | | |
|---|---|---|---|
| 6,628,615 | B1 | 9/2003 | Joseph et al. |
| 6,754,185 | B1 | 6/2004 | Banerjee et al. |
| 7,583,600 | B1 | 9/2009 | Schanke et al. |
| 9,507,746 | B2 | 11/2016 | Willey et al. |
| 9,740,654 | B2 | 8/2017 | Willey et al. |
| 2005/0216638 | A1 | 9/2005 | Smith et al. |
| 2005/0271054 | A1 | 12/2005 | Kang et al. |
| 2006/0126656 | A1 | 6/2006 | Ayyar et al. |
| 2007/0133415 | A1 | 6/2007 | Spink |
| 2009/0265472 | A1 | 10/2009 | Ayyar et al. |

(Continued)

FOREIGN PATENT DOCUMENTS

| | | |
|---|---|---|
| CN | 10132546 | 12/2008 |
| CN | 101867401 B | 11/2013 |
| EP | 1444588 B1 | 3/2009 |

OTHER PUBLICATIONS

DE Office Action issued in DE Patent Application No. 112013005090.0 dated Aug. 23, 2017 with English translation, 13 pages.

(Continued)

*Primary Examiner* — Glenn A. Auve
(74) *Attorney, Agent, or Firm* — Alliance IP, LLC

(57) ABSTRACT

A link layer control message is generated and included in a flit that is to be sent over a serial data link to a device. The flits sent over the data link are to include a plurality of slots. Control messages can include, in some aspects, a viral alert message, a poison alert message, a credit return message, and acknowledgements.

24 Claims, 15 Drawing Sheets

(56) References Cited

U.S. PATENT DOCUMENTS

| | | | |
|---|---|---|---|
| 2009/0300292 | A1 | 12/2009 | Fang et al. |
| 2011/0246692 | A1 | 10/2011 | Valk et al. |
| 2011/0307577 | A1 | 12/2011 | McDaniel et al. |
| 2012/0079156 | A1 | 3/2012 | Safranek et al. |
| 2012/0079160 | A1 | 3/2012 | Iyer et al. |
| 2013/0034666 | A1 | 2/2013 | Liang |
| 2013/0051397 | A1 | 2/2013 | Guo et al. |
| 2013/0083798 | A1 | 4/2013 | Lakshmanamurthy et al. |
| 2014/0115208 | A1 | 4/2014 | Willey et al. |
| 2015/0003247 | A1 | 1/2015 | Mejia et al. |
| 2015/0186327 | A1 | 7/2015 | Willey et al. |

OTHER PUBLICATIONS

SIPO, second CN Office Action issued in CN Patent Application No. 201380049212.2 dated Sep. 6, 2017 with Summary of Relevance, 12 pages.

PCT International Preliminary Report on Patentability received for PCT Patent Application No. PCT/US2013/032601 dated Apr. 28, 2015.

Final Office Action in U.S. Appl. No. 13/976,966 dated Mar. 30, 2016 (6 pages).

International Search Report and Written Opinion received for PCT Patent Application No. PCT/US2013/032601 dated Jul. 15, 2013, 9 pages.

Korean Patent Office Notice of Preliminary Rejection in Application No. 2015-7007228 dated Jan. 8, 2016.

Non Final Office Action in U.S. Appl. No. 13/976,966 dated Dec. 2, 2015 (8 pages).

Notice of Allowance in U.S. Appl. No. 13/976,966 dated Jul. 15, 2016 (5 pages).

Non Final Office Action in U.S. Appl. No. 14/583,554 dated Dec. 14, 2016 (5 pages).

Chinese Notice of First Office Action in Chinese Patent Application No. 201380049212.2 dated Nov. 4, 2016 [13 pages including Summary of Relevance].

Korean Patent Office Notice of Preliminary Rejection in Korean Patent Application No. 2015-7007228 dated Apr. 19, 2017, 8 pages.

|      | L7  | L6  | L5  | L4  | L3 | L2 | L1 | L0 |
|------|-----|-----|-----|-----|----|----|----|----|
| UI0  | 191 | 167 | 143 | 119 | 95 | 71 | 47 | 23 |
| UI1  | 190 | 166 | 142 | 118 | 94 | 70 | 46 | 22 |
| UI2  | 189 | 165 | 141 | 117 | 93 | 69 | 45 | 21 |
| UI3  | 188 | 164 | 140 | 116 | 92 | 68 | 44 | 20 |
| UI4  | 187 | 163 | 139 | 115 | 91 | 67 | 43 | 19 |
| UI5  | 186 | 162 | 138 | 114 | 90 | 66 | 42 | 18 |
| UI6  | 185 | 161 | 137 | 113 | 89 | 65 | 41 | 17 |
| UI7  | 184 | 160 | 136 | 112 | 88 | 64 | 40 | 16 |
| UI8  | 183 | 159 | 135 | 111 | 87 | 63 | 39 | 15 |
| UI9  | 182 | 158 | 134 | 110 | 86 | 62 | 38 | 14 |
| UI10 | 181 | 157 | 133 | 109 | 85 | 61 | 37 | 13 |
| UI11 | 180 | 156 | 132 | 108 | 84 | 60 | 36 | 12 |
| UI12 | 179 | 155 | 131 | 107 | 83 | 59 | 35 | 11 |
| UI13 | 178 | 154 | 130 | 106 | 82 | 58 | 34 | 10 |
| UI14 | 177 | 153 | 129 | 105 | 81 | 57 | 33 | 9  |
| UI15 | 176 | 152 | 128 | 104 | 80 | 56 | 32 | 8  |
| UI16 | 175 | 151 | 127 | 103 | 79 | 55 | 31 | 7  |
| UI17 | 174 | 150 | 126 | 102 | 78 | 54 | 30 | 6  |
| UI18 | 173 | 149 | 125 | 101 | 77 | 53 | 29 | 5  |
| UI19 | 172 | 148 | 124 | 100 | 76 | 52 | 28 | 4  |
| UI20 | 171 | 147 | 123 | 99  | 75 | 51 | 27 | 3  |
| UI21 | 170 | 146 | 122 | 98  | 74 | 50 | 26 | 2  |
| UI22 | 169 | 145 | 121 | 97  | 73 | 49 | 25 | 1  |
| UI23 | 168 | 144 | 120 | 96  | 72 | 48 | 24 | 0  |

*Fig. 7*

| UI | 0 | 1 | 2 | 3 | 4 | 5 | 6 | 7 |
|---|---|---|---|---|---|---|---|---|
| 0,1,2,3 | 5 | 11 | 17 | 23 | 29 | 35 | 41 | 47 |
| 4,5,6,7 | 4 | 10 | 16 | 22 | 28 | 34 | 40 | 46 |
| 8, 9, 10, 11 | 3 | 9 | 15 | 21 | 27 | 33 | 39 | 45 |
| 12,13,14,15 | 2 | 8 | 14 | 20 | 26 | 32 | 38 | 44 |
| 16,17,18,19 | 1 | 7 | 13 | 19 | 25 | 31 | 37 | 43 |
| 20,21,22,23 | 0 | 6 | 12 | 18 | 24 | 30 | 36 | 42 |

CONTROL MESSAGING IN MULTISLOT LINK LAYER FLIT

CROSS-REFERENCE TO RELATED APPLICATIONS

This Application is a continuation (and claims the benefit of priority under 35 U.S.C. § 120) of U.S. application Ser. No. 14/583,554, filed Dec. 26, 2014, which is a continuation of U.S. application Ser. No. 13/976,966, with an effective filing date of Mar. 15, 2013 and a U.S. 371 filing date of Jun. 27, 2013 and entitled CONTROL MESSAGING IN MULTISLOT LINK LAYER FLIT, now U.S. Pat. No. 9,507,746 issued Nov. 29, 2016, which application is a national stage application under 35 U.S.C. § 371 of PCT International Application Serial No. PCT/US2013/032601, filed on Mar. 15, 2013 and entitled CONTROL MESSAGING IN MULTISLOT LINK LAYER FLIT, which application claims the benefit of priority to U.S. Provisional Patent Application Ser. No. 61/717,091 filed on Oct. 22, 2012 and entitled METHOD, APPARATUS, SYSTEM FOR A HIGH PERFORMANCE INTERCONNECT ARCHITECTURE. The disclosures of the prior applications are considered part of and are hereby incorporated by reference in their entirety in the disclosure of this application.

FIELD

The present disclosure relates in general to the field of computer development, and more specifically, to software development involving coordination of mutually-dependent constrained systems.

BACKGROUND

Advances in semi-conductor processing and logic design have permitted an increase in the amount of logic that may be present on integrated circuit devices. As a corollary, computer system configurations have evolved from a single or multiple integrated circuits in a system to multiple cores, multiple hardware threads, and multiple logical processors present on individual integrated circuits, as well as other interfaces integrated within such processors. A processor or integrated circuit typically comprises a single physical processor die, where the processor die may include any number of cores, hardware threads, logical processors, interfaces, memory, controller hubs, etc.

As a result of the greater ability to fit more processing power in smaller packages, smaller computing devices have increased in popularity. Smartphones, tablets, ultrathin notebooks, and other user equipment have grown exponentially. However, these smaller devices are reliant on servers both for data storage and complex processing that exceeds the form factor. Consequently, the demand in the high-performance computing market (i.e. server space) has also increased. For instance, in modern servers, there is typically not only a single processor with multiple cores, but also multiple physical processors (also referred to as multiple sockets) to increase the computing power. But as the processing power grows along with the number of devices in a computing system, the communication between sockets and other devices becomes more critical.

In fact, interconnects have grown from more traditional multi-drop buses that primarily handled electrical communications to full blown interconnect architectures that facilitate fast communication. Unfortunately, as the demand for future processors to consume at even higher-rates corresponding demand is placed on the capabilities of existing interconnect architectures.

BRIEF DESCRIPTION OF THE DRAWINGS

FIG. 7 illustrates a representation of an example flit sent over an example eight-lane data link.

FIG. 8 illustrates a representation of an example flit sent over an example eight-lane data link.

FIG. 9 illustrates a representation of an example flit sent over an example twenty-lane data link.

Like reference numbers and designations in the various drawings indicate like elements.

DETAILED DESCRIPTION

Figure 1:
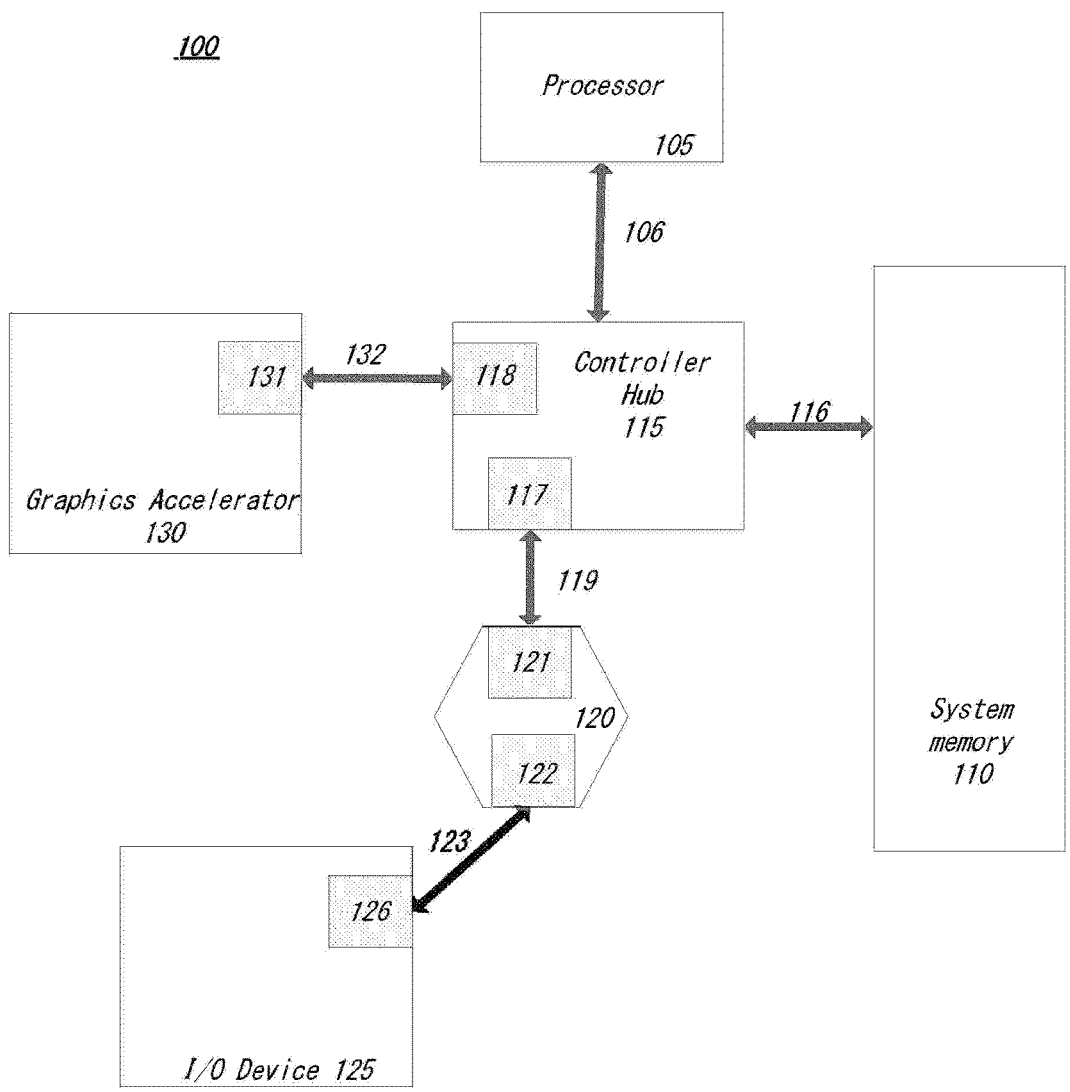
FIG. 1 illustrates a simplified block diagram of a system including a serial point-to-point interconnect to connect I/O devices in a computer system in accordance with one embodiment.

In the following description, numerous specific details are set forth, such as examples of specific types of processors and system configurations, specific hardware structures, specific architectural and micro architectural details, specific register configurations, specific instruction types, specific system components, specific processor pipeline stages, specific interconnect layers, specific packet/transaction configurations, specific transaction names, specific protocol exchanges, specific link widths, specific implementations, and operation etc. in order to provide a thorough understanding of the present invention. It may be apparent, however, to one skilled in the art that these specific details need not necessarily be employed to practice the subject matter of the present disclosure. In other instances, well detailed description of known components or methods has been avoided, such as specific and alternative processor architectures, specific logic circuits/code for described algorithms, specific firmware code, low-level interconnect operation, specific logic configurations, specific manufacturing techniques and materials, specific compiler implementations, specific expression of algorithms in code, specific power down and gating techniques/logic and other specific operational details of computer system in order to avoid unnecessarily obscuring the present disclosure.

Although the following embodiments may be described with reference to energy conservation, energy efficiency, processing efficiency, and so on in specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from such features. For example, the disclosed embodiments are not limited to server computer system, desktop computer systems, laptops, Ultrabooks™, but may be also used in other devices, such as handheld devices, smartphones, tablets, other thin notebooks, systems on a chip (SOC) devices, and embedded applications. Some examples of handheld devices include cellular phones, Internet protocol devices, digital cameras, personal digital assistants (PDAs), and handheld PCs. Here, similar techniques for a high-performance interconnect may be applied to increase performance (or even save power) in a low power interconnect. Embedded applications typically include a microcontroller, a digital signal processor (DSP), a system on a chip, network computers (NetPC), set-top boxes, network hubs, wide area network (WAN) switches, or any other system that can perform the functions and operations taught below. Moreover, the apparatus', methods, and systems described herein are not limited to physical computing devices, but may also relate to software optimizations for energy conservation and efficiency. As may become readily apparent in the description below, the embodiments of methods, apparatus', and systems described herein (whether in reference to hardware, firmware, software, or a combination thereof) may be considered vital to a "green technology" future balanced with performance considerations.

As computing systems are advancing, the components therein are becoming more complex. The interconnect architecture to couple and communicate between the components has also increased in complexity to ensure bandwidth demand is met for optimal component operation. Furthermore, different market segments demand different aspects of interconnect architectures to suit the respective market. For example, servers require higher performance, while the mobile ecosystem is sometimes able to sacrifice overall performance for power savings. Yet, it is a singular purpose of most fabrics to provide highest possible performance with maximum power saving. Further, a variety of different interconnects can potentially benefit from subject matter described herein. For instance, the Peripheral Component Interconnect (PCI) Express (PCIe) interconnect fabric architecture and QuickPath Interconnect (QPI) fabric architecture, among other examples, can potentially be improved according to one or more principles described herein, among other examples.

FIG. 1 illustrates one embodiment of a fabric composed of point-to-point Links that interconnect a set of components is illustrated. System 100 includes processor 105 and system memory 110 coupled to controller hub 115. Processor 105 can include any processing element, such as a microprocessor, a host processor, an embedded processor, a co-processor, or other processor. Processor 105 is coupled to controller hub 115 through front-side bus (FSB) 106. In one embodiment, FSB 106 is a serial point-to-point interconnect as described below. In another embodiment, link 106 includes a serial, differential interconnect architecture that is compliant with different interconnect standard.

System memory 110 includes any memory device, such as random access memory (RAM), non-volatile (NV) memory, or other memory accessible by devices in system 100. System memory 110 is coupled to controller hub 115 through memory interface 116. Examples of a memory interface include a double-data rate (DDR) memory interface, a dual-channel DDR memory interface, and a dynamic RAM (DRAM) memory interface.

In one embodiment, controller hub 115 can include a root hub, root complex, or root controller, such as in a PCIe interconnection hierarchy. Examples of controller hub 115 include a chipset, a memory controller hub (MCH), a northbridge, an interconnect controller hub (ICH) a southbridge, and a root controller/hub. Often the term chipset refers to two physically separate controller hubs, e.g., a memory controller hub (MCH) coupled to an interconnect controller hub (ICH). Note that current systems often include the MCH integrated with processor 105, while controller 115 is to communicate with I/O devices, in a similar manner as described below. In some embodiments, peer-to-peer routing is optionally supported through root complex 115.

Here, controller hub 115 is coupled to switch/bridge 120 through serial link 119. Input/output modules 117 and 121, which may also be referred to as interfaces/ports 117 and 121, can include/implement a layered protocol stack to provide communication between controller hub 115 and switch 120. In one embodiment, multiple devices are capable of being coupled to switch 120.

Switch/bridge 120 routes packets/messages from device 125 upstream, i.e. up a hierarchy towards a root complex, to controller hub 115 and downstream, i.e. down a hierarchy away from a root controller, from processor 105 or system memory 110 to device 125. Switch 120, in one embodiment, is referred to as a logical assembly of multiple virtual PCI-to-PCI bridge devices. Device 125 includes any internal or external device or component to be coupled to an electronic system, such as an I/O device, a Network Interface Controller (NIC), an add-in card, an audio processor, a network processor, a hard-drive, a storage device, a CD/DVD ROM, a monitor, a printer, a mouse, a keyboard, a router, a portable storage device, a Firewire device, a Universal Serial Bus (USB) device, a scanner, and other input/output devices. Often in the PCIe vernacular, such as device, is referred to as an endpoint. Although not specifically shown, device 125 may include a bridge (e.g., a PCIe to PCI/PCI-X bridge) to support legacy or other versions of devices or interconnect fabrics supported by such devices.

Graphics accelerator 130 can also be coupled to controller hub 115 through serial link 132. In one embodiment, graphics accelerator 130 is coupled to an MCH, which is coupled to an ICH. Switch 120, and accordingly I/O device 125, is then coupled to the ICH. I/O modules 131 and 118 are also to implement a layered protocol stack and associated logic to communicate between graphics accelerator 130 and controller hub 115. Similar to the MCH discussion above, a graphics controller or the graphics accelerator 130 itself may be integrated in processor 105.

Figure 2:
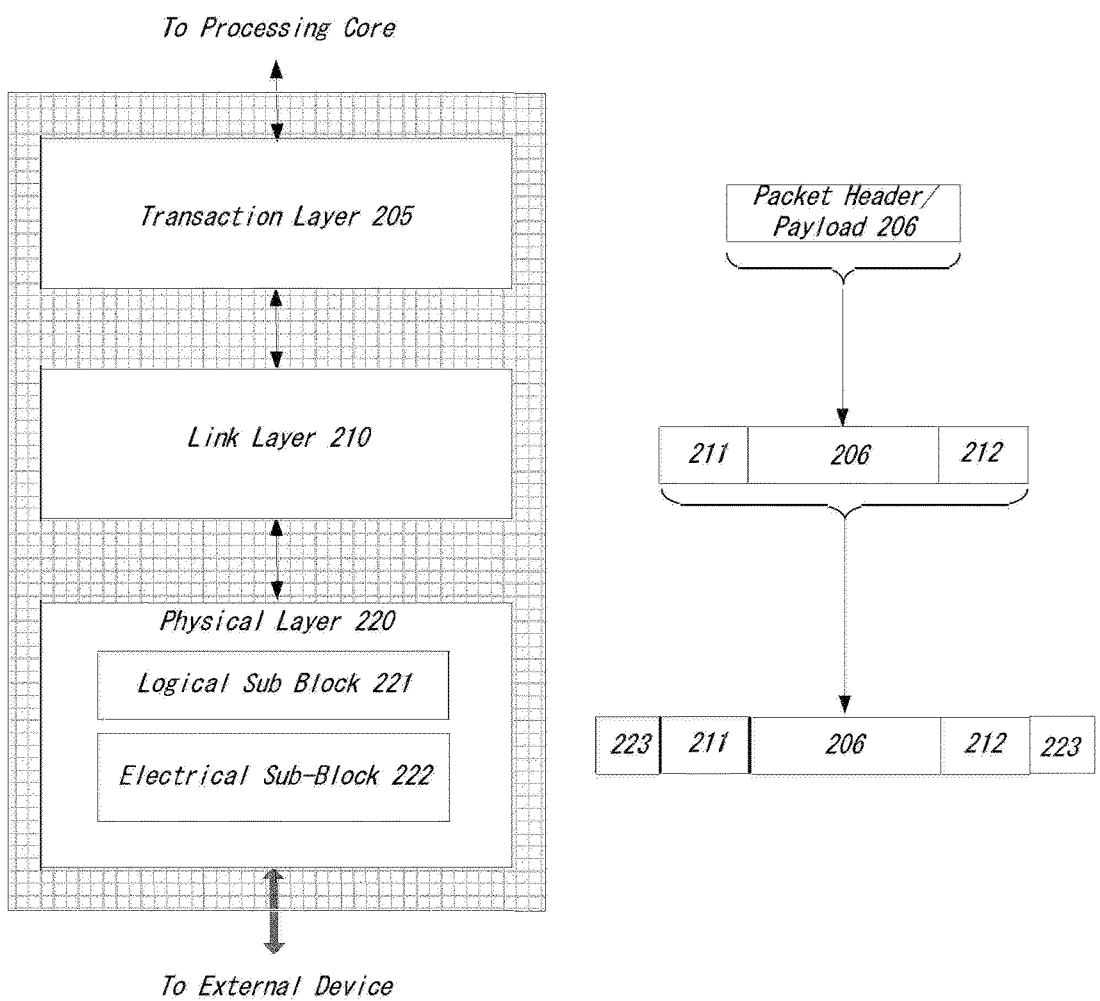
FIG. 2 illustrates a simplified block diagram of a layered protocol stack in accordance with one embodiment.

Turning to FIG. 2 an embodiment of a layered protocol stack is illustrated. Layered protocol stack 200 can includes any form of a layered communication stack, such as a QPI stack, a PCIe stack, a next generation high performance computing interconnect (HPI) stack, or other layered stack. In one embodiment, protocol stack 200 can include transaction layer 205, link layer 210, and physical layer 220. An interface, such as interfaces 117, 118, 121, 122, 126, and 131 in FIG. 1, may be represented as communication protocol stack 200. Representation as a communication protocol stack may also be referred to as a module or interface implementing/including a protocol stack.

Packets can be used to communicate information between components. Packets can be formed in the Transaction Layer 205 and Data Link Layer 210 to carry the information from the transmitting component to the receiving component. As the transmitted packets flow through the other layers, they are extended with additional information used to handle packets at those layers. At the receiving side the reverse process occurs and packets get transformed from their Physical Layer 220 representation to the Data Link Layer 210 representation and finally (for Transaction Layer Packets) to the form that can be processed by the Transaction Layer 205 of the receiving device.

In one embodiment, transaction layer 205 can provide an interface between a device's processing core and the interconnect architecture, such as Data Link Layer 210 and Physical Layer 220. In this regard, a primary responsibility of the transaction layer 205 can include the assembly and disassembly of packets (i.e., transaction layer packets, or TLPs). The translation layer 205 can also manage credit-based flow control for TLPs. In some implementations, split transactions can be utilized, i.e., transactions with request and response separated by time, allowing a link to carry other traffic while the target device gathers data for the response, among other examples.

Credit-based flow control can be used to realize virtual channels and networks utilizing the interconnect fabric. In one example, a device can advertise an initial amount of credits for each of the receive buffers in Transaction Layer 205. An external device at the opposite end of the link, such as controller hub 115 in FIG. 1, can count the number of credits consumed by each TLP. A transaction may be transmitted if the transaction does not exceed a credit limit. Upon receiving a response an amount of credit is restored. One example of an advantage of such a credit scheme is that the latency of credit return does not affect performance, provided that the credit limit is not encountered, among other potential advantages.

In one embodiment, four transaction address spaces can include a configuration address space, a memory address space, an input/output address space, and a message address space. Memory space transactions include one or more of read requests and write requests to transfer data to/from a memory-mapped location. In one embodiment, memory space transactions are capable of using two different address formats, e.g., a short address format, such as a 32-bit address, or a long address format, such as 64-bit address. Configuration space transactions can be used to access configuration space of various devices connected to the interconnect. Transactions to the configuration space can include read requests and write requests. Message space transactions (or, simply messages) can also be defined to support in-band communication between interconnect agents. Therefore, in one example embodiment, transaction layer 205 can assemble packet header/payload 206.

A Link layer 210, also referred to as data link layer 210, can act as an intermediate stage between transaction layer 205 and the physical layer 220. In one embodiment, a responsibility of the data link layer 210 is providing a reliable mechanism for exchanging Transaction Layer Packets (TLPs) between two components on a link. One side of the Data Link Layer 210 accepts TLPs assembled by the Transaction Layer 205, applies packet sequence identifier 211, i.e. an identification number or packet number, calculates and applies an error detection code, i.e. CRC 212, and submits the modified TLPs to the Physical Layer 220 for transmission across a physical to an external device.

In one example, physical layer 220 includes logical sub block 221 and electrical sub-block 222 to physically transmit a packet to an external device. Here, logical sub-block 221 is responsible for the "digital" functions of Physical Layer 221. In this regard, the logical sub-block can include a transmit section to prepare outgoing information for transmission by physical sub-block 222, and a receiver section to identify and prepare received information before passing it to the Link Layer 210.

Physical block 222 includes a transmitter and a receiver. The transmitter is supplied by logical sub-block 221 with symbols, which the transmitter serializes and transmits onto to an external device. The receiver is supplied with serialized symbols from an external device and transforms the received signals into a bit-stream. The bit-stream is de-serialized and supplied to logical sub-block 221. In one example embodiment, an 8 b/10 b transmission code is employed, where ten-bit symbols are transmitted/received. Here, special symbols are used to frame a packet with frames 223. In addition, in one example, the receiver also provides a symbol clock recovered from the incoming serial stream.

As stated above, although transaction layer 205, link layer 210, and physical layer 220 are discussed in reference to a specific embodiment of a protocol stack (such as a PCIe protocol stack), a layered protocol stack is not so limited. In fact, any layered protocol may be included/implemented and adopt features discussed herein. As an example, a port/interface that is represented as a layered protocol can include: (1) a first layer to assemble packets, i.e. a transaction layer; a second layer to sequence packets, i.e. a link layer; and a third layer to transmit the packets, i.e. a physical layer. As a specific example, a high performance interconnect layered protocol, as described herein, is utilized.

Figure 3:
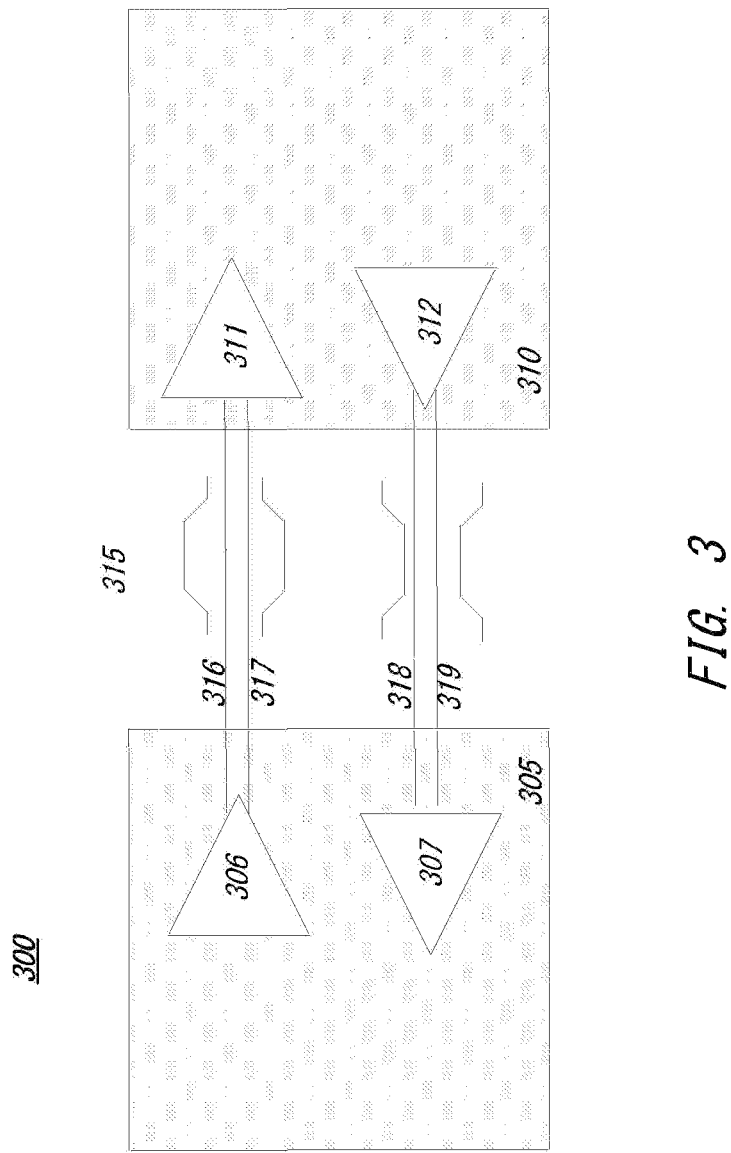
FIG. 3 illustrates an embodiment of a serial point-to-point link.

Referring next to FIG. 3, an example embodiment of a serial point to point fabric is illustrated. A serial point-to-point link can include any transmission path for transmitting serial data. In the embodiment shown, a link can include two, low-voltage, differentially driven signal pairs: a transmit pair 306/311 and a receive pair 312/307. Accordingly, device 305 includes transmission logic 306 to transmit data to device 310 and receiving logic 307 to receive data from device 310. In other words, two transmitting paths, i.e. paths 316 and 317, and two receiving paths, i.e. paths 318 and 319, are included in some implementations of a link.

A transmission path refers to any path for transmitting data, such as a transmission line, a copper line, an optical line, a wireless communication channel, an infrared communication link, or other communication path. A connection between two devices, such as device 305 and device 310, is referred to as a link, such as link 315. A link may support one lane—each lane representing a set of differential signal pairs (one pair for transmission, one pair for reception). To scale bandwidth, a link may aggregate multiple lanes denoted by ×N, where N is any supported link width, such as 1, 2, 4, 8, 12, 16, 32, 64, or wider.

A differential pair can refer to two transmission paths, such as lines 316 and 317, to transmit differential signals. As an example, when line 316 toggles from a low voltage level to a high voltage level, i.e. a rising edge, line 317 drives from a high logic level to a low logic level, i.e. a falling edge. Differential signals potentially demonstrate better electrical characteristics, such as better signal integrity, i.e. cross-coupling, voltage overshoot/undershoot, ringing, among other example advantages. This allows for a better timing window, which enables faster transmission frequencies.

In one embodiment, a new High Performance Interconnect (HPI) is provided. HPI can include a next-generation cache-coherent, link-based interconnect. As one example, HPI may be utilized in high performance computing platforms, such as workstations or servers, including in systems where PCIe or another interconnect protocol is typically used to connect processors, accelerators, I/O devices, and the like. However, HPI is not so limited. Instead, HPI may be utilized in any of the systems or platforms described herein. Furthermore, the individual ideas developed may be applied to other interconnects and platforms, such as PCIe, MIPI, QPI, etc.

Figure 4:
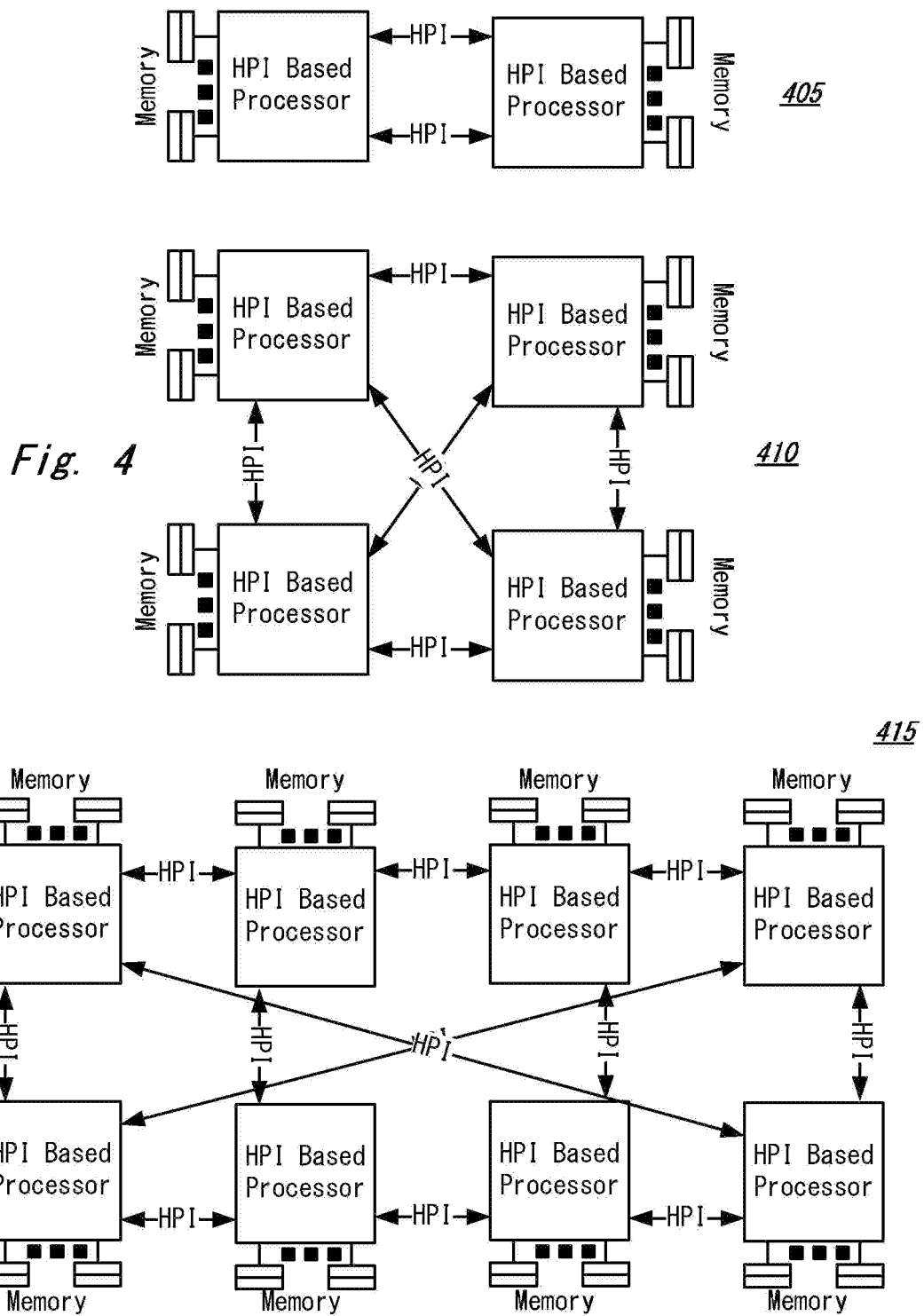
FIG. 4 illustrates embodiments of potential High Performance Interconnect (HPI) system configurations.

To support multiple devices, in one example implementation, HPI can include an Instruction Set Architecture (ISA) agnostic (i.e. HPI is able to be implemented in multiple different devices). In another scenario, HPI may also be utilized to connect high performance I/O devices, not just processors or accelerators. For example, a high performance PCIe device may be coupled to HPI through an appropriate translation bridge (i.e. HPI to PCIe). Moreover, the HPI links may be utilized by many HPI based devices, such as processors, in various ways (e.g. stars, rings, meshes, etc.). FIG. 4 illustrates example implementations of multiple potential multi-socket configurations. A two-socket configuration 405, as depicted, can include two HPI links; however, in other implementations, one HPI link may be utilized. For larger topologies, any configuration may be utilized as long as an identifier (ID) is assignable and there is some form of virtual path, among other additional or substitute features. As shown, in one example, a four socket configuration 410 has an HPI link from each processor to another. But in the eight socket implementation shown in configuration 415, not every socket is directly connected to each other through an HPI link. However, if a virtual path or channel exists between the processors, the configuration is supported. A range of supported processors includes 2-32 in a native domain. Higher numbers of processors may be reached through use of multiple domains or other interconnects between node controllers, among other examples.

Figure 5:
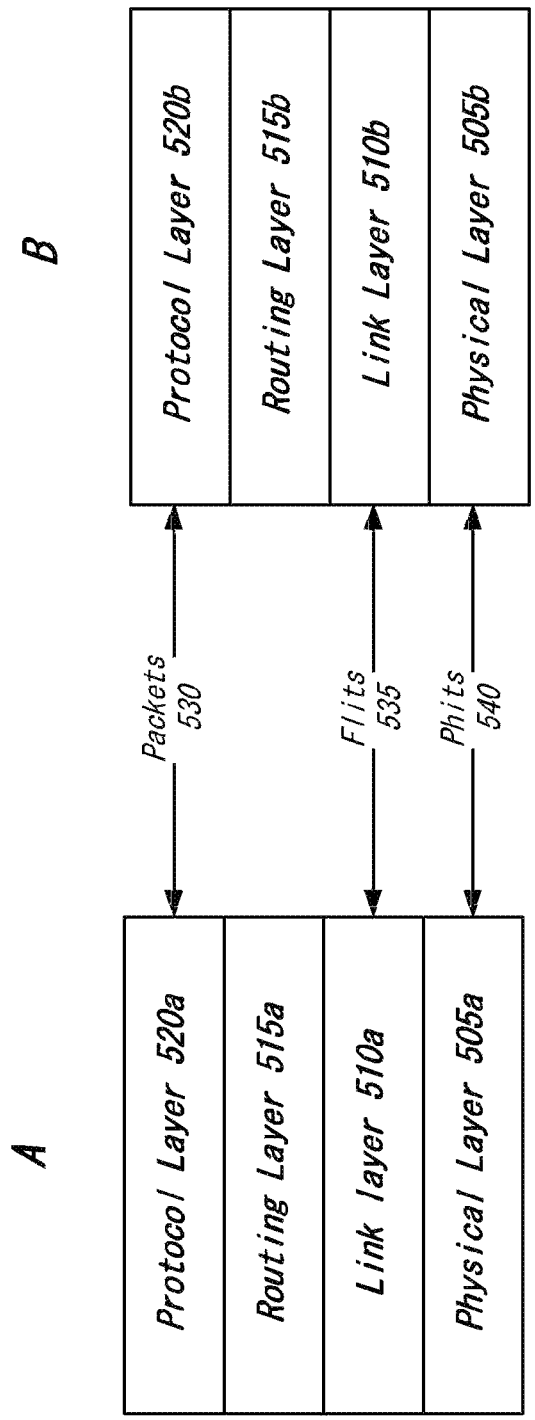
FIG. 5 illustrates an embodiment of a layered protocol stack associated with HPI.

The HPI architecture includes a definition of a layered protocol architecture, including in some examples, protocol layers (coherent, non-coherent, and, optionally, other memory based protocols), a routing layer, a link layer, and a physical layer including associated I/O logic. Furthermore, HPI can further include enhancements related to power managers (such as power control units (PCUs)), design for test and debug (DFT), fault handling, registers, security, among other examples. FIG. 5 illustrates an embodiment of an example HPI layered protocol stack. In some implementations, at least some of the layers illustrated in FIG. 5 may be optional. Each layer deals with its own level of granularity or quantum of information (the protocol layer 505a,b with packets 530, link layer 510a,b with flits 535, and physical layer 505a,b with phits 540). Note that a packet, in some embodiments, may include partial flits, a single flit, or multiple flits based on the implementation.

As a first example, a width of a phit 540 includes a 1 to 1 mapping of link width to bits (e.g. 20 bit link width includes a phit of 20 bits, etc.). Flits may have a greater size, such as 184, 192, or 200 bits. Note that if phit 540 is 20 bits wide and the size of flit 535 is 184 bits then it takes a fractional number of phits 540 to transmit one flit 535 (e.g. 9.2 phits at 20 bits to transmit an 184 bit flit 535 or 9.6 at 20 bits to transmit a 192 bit flit, among other examples). Note that widths of the fundamental link at the physical layer may vary. For example, the number of lanes per direction may include 2, 4, 6, 8, 10, 12, 14, 16, 18, 20, 22, 24, etc. In one embodiment, link layer 510a,b is capable of embedding multiple pieces of different transactions in a single flit, and one or multiple headers (e.g. 1, 2, 3, 4) may be embedded within the flit. In one example, HPI splits the headers into corresponding slots to enable multiple messages in the flit destined for different nodes.

Physical layer 505a,b, in one embodiment, can be responsible for the fast transfer of information on the physical medium (electrical or optical etc.). The physical link can be point-to-point between two Link layer entities, such as layer 505a and 505b. The Link layer 510a,b can abstract the Physical layer 505a,b from the upper layers and provides the capability to reliably transfer data (as well as requests) and manage flow control between two directly connected entities. The Link Layer can also be responsible for virtualizing the physical channel into multiple virtual channels and message classes. The Protocol layer 520a,b relies on the Link layer 510a,b to map protocol messages into the appropriate message classes and virtual channels before handing them to the Physical layer 505a,b for transfer across the physical links. Link layer 510a,b may support multiple messages, such as a request, snoop, response, writeback, non-coherent data, among other examples.

The Physical layer 505a,b (or PHY) of HPI can be implemented above the electrical layer (i.e. electrical conductors connecting two components) and below the link layer 510a,b, as illustrated in FIG. 5. The Physical layer and corresponding logic can reside on each agent and connects the link layers on two agents (A and B) separated from each other (e.g. on devices on either side of a link). The local and remote electrical layers are connected by physical media (e.g. wires, conductors, optical, etc.). The Physical layer 505a,b, in one embodiment, has two major phases, initialization and operation. During initialization, the connection is opaque to the link layer and signaling may involve a combination of timed states and handshake events. During operation, the connection is transparent to the link layer and signaling is at a speed, with all lanes operating together as a single link. During the operation phase, the Physical layer transports flits from agent A to agent B and from agent B to agent A. The connection is also referred to as a link and abstracts some physical aspects including media, width and speed from the link layers while exchanging flits and control/status of current configuration (e.g. width) with the link layer. The initialization phase includes minor phases e.g. Polling, Configuration. The operation phase also includes minor phases (e.g. link power management states).

In one embodiment, Link layer 510a,b can be implemented so as to provide reliable data transfer between two protocol or routing entities. The Link layer can abstract Physical layer 505a,b from the Protocol layer 520a,b, and can be responsible for the flow control between two protocol agents (A, B), and provide virtual channel services to the Protocol layer (Message Classes) and Routing layer (Virtual Networks). The interface between the Protocol layer 520a,b and the Link Layer 510a,b can typically be at the packet level. In one embodiment, the smallest transfer unit at the Link Layer is referred to as a flit which a specified number of bits, such as 192 bits or some other denomination. The Link Layer 510a,b relies on the Physical layer 505a,b to frame the Physical layer's 505a,b unit of transfer (phit) into the Link Layer's 510a,b unit of transfer (flit). In addition, the Link Layer 510a,b may be logically broken into two parts, a sender and a receiver. A sender/receiver pair on one entity may be connected to a receiver/sender pair on another entity. Flow Control is often performed on both a flit and a packet basis. Error detection and correction is also potentially performed on a flit level basis.

In one embodiment, Routing layer 515a,b can provide a flexible and distributed method to route HPI transactions from a source to a destination. The scheme is flexible since routing algorithms for multiple topologies may be specified through programmable routing tables at each router (the programming in one embodiment is performed by firmware, software, or a combination thereof). The routing functionality may be distributed; the routing may be done through a series of routing steps, with each routing step being defined through a lookup of a table at either the source, intermediate, or destination routers. The lookup at a source may be used to inject a HPI packet into the HPI fabric. The lookup at an intermediate router may be used to route an HPI packet from an input port to an output port. The lookup at a destination port may be used to target the destination HPI protocol agent. Note that the Routing layer, in some implementations, can be thin since the routing tables, and, hence the routing algorithms, are not specifically defined by specification. This allows for flexibility and a variety of usage models, including flexible platform architectural topologies to be defined by the system implementation. The Routing layer 515a,b relies on the Link layer 510a,b for providing the use of up to three (or more) virtual networks (VNs)—in one example, two deadlock-free VNs, VN0 and VN1 with several message classes defined in each virtual network. A shared adaptive virtual network (VNA) may be defined in the Link layer, but this adaptive network may not be exposed directly in routing concepts, since each message class and virtual network may have dedicated resources and guaranteed forward progress, among other features and examples.

In one embodiment, HPI can include a Coherence Protocol layer 520a,b is support agents caching lines of data from memory. An agent wishing to cache memory data may use the coherence protocol to read the line of data to load into its cache. An agent wishing to modify a line of data in its cache may use the coherence protocol to acquire ownership of the line before modifying the data. After modifying a line, an agent may follow protocol requirements of keeping it in its cache until it either writes the line back to memory or includes the line in a response to an external request. Lastly, an agent may fulfill external requests to invalidate a line in its cache. The protocol ensures coherency of the data by dictating the rules all caching agents may follow. It also provides the means for agents without caches to coherently read and write memory data.

Two conditions may be enforced to support transactions utilizing the HPI Coherence Protocol. First, the protocol can maintain data consistency, as an example, on a per-address basis, among data in agents' caches and between those data and the data in memory. Informally, data consistency may refer to each valid line of data in an agent's cache representing a most up-to-date value of the data and data transmitted in a coherence protocol packet can represent the most up-to-date value of the data at the time it was sent. When no valid copy of the data exists in caches or in transmission, the protocol may ensure the most up-to-date value of the data resides in memory. Second, the protocol can provide well-defined commitment points for requests. Commitment points for reads may indicate when the data is usable; and for writes they may indicate when the written data is globally observable and will be loaded by subsequent reads. The protocol may support these commitment points for both cacheable and uncacheable (UC) requests in the coherent memory space.

The HPI Coherence Protocol also may ensure the forward progress of coherence requests made by an agent to an address in the coherent memory space. Certainly, transactions may eventually be satisfied and retired for proper system operation. The HPI Coherence Protocol, in some embodiments, may have no notion of retry for resolving resource allocation conflicts. Thus, the protocol itself may be defined to contain no circular resource dependencies, and implementations may take care in their designs not to introduce dependencies that can result in deadlocks. Additionally, the protocol may indicate where designs are able to provide fair access to protocol resources.

Logically, the HPI Coherence Protocol, in one embodiment, can include three items: coherence (or caching) agents, home agents, and the HPI interconnect fabric connecting the agents. Coherence agents and home agents can work together to achieve data consistency by exchanging messages over the interconnect. The link layer 510a,b and its related description can provide the details of the interconnect fabric including how it adheres to the coherence protocol's requirements, discussed herein. (It may be noted that the division into coherence agents and home agents is for clarity. A design may contain multiple agents of both types within a socket or even combine agents behaviors into a single design unit, among other examples.)

In some implementations, HPI can utilize an embedded clock. A clock signal can be embedded in data transmitted using the interconnect. With the clock signal embedded in the data, distinct and dedicated clock lanes can be omitted. This can be useful, for instance, as it can allow more pins of a device to be dedicated to data transfer, particularly in systems where space for pins is at a premium.

The Link layer can guarantee reliable data transfer between two protocol or routing entities. The Link layer can abstract the Physical layer from the Protocol layer, handle flow control between two protocol agents, and provide virtual channel services to the Protocol layer (Message Classes) and Routing layer (Virtual Networks).

In some implementations, the Link layer can deal with a fixed quantum of information, termed a flit. In one example, the flit can be defined to be 192 bits in length. However, any range of bits, such as 81-256 (or more) may be utilized in different variations. A large flit size, such as 192 bits, may include format, cyclic redundancy check (CRC), and other changes. For instance, a larger flit length can also permit the CRC field to be expanded (e.g., to 16 bits) to handle the larger flit payload. The number of phits or unit intervals (UI) (e.g., the time used to transfer a single bit or phit, etc.) to transfer a single flit can vary with link width. For instance, a 20 lane or bit link width can transfer a single 192 bit flit in 9.6 UI, while an 8 lane link width transfers the same flit in 24 UI, among other potential examples. The link layer crediting and protocol packetizing can also be based on a flit.

Figure 6:
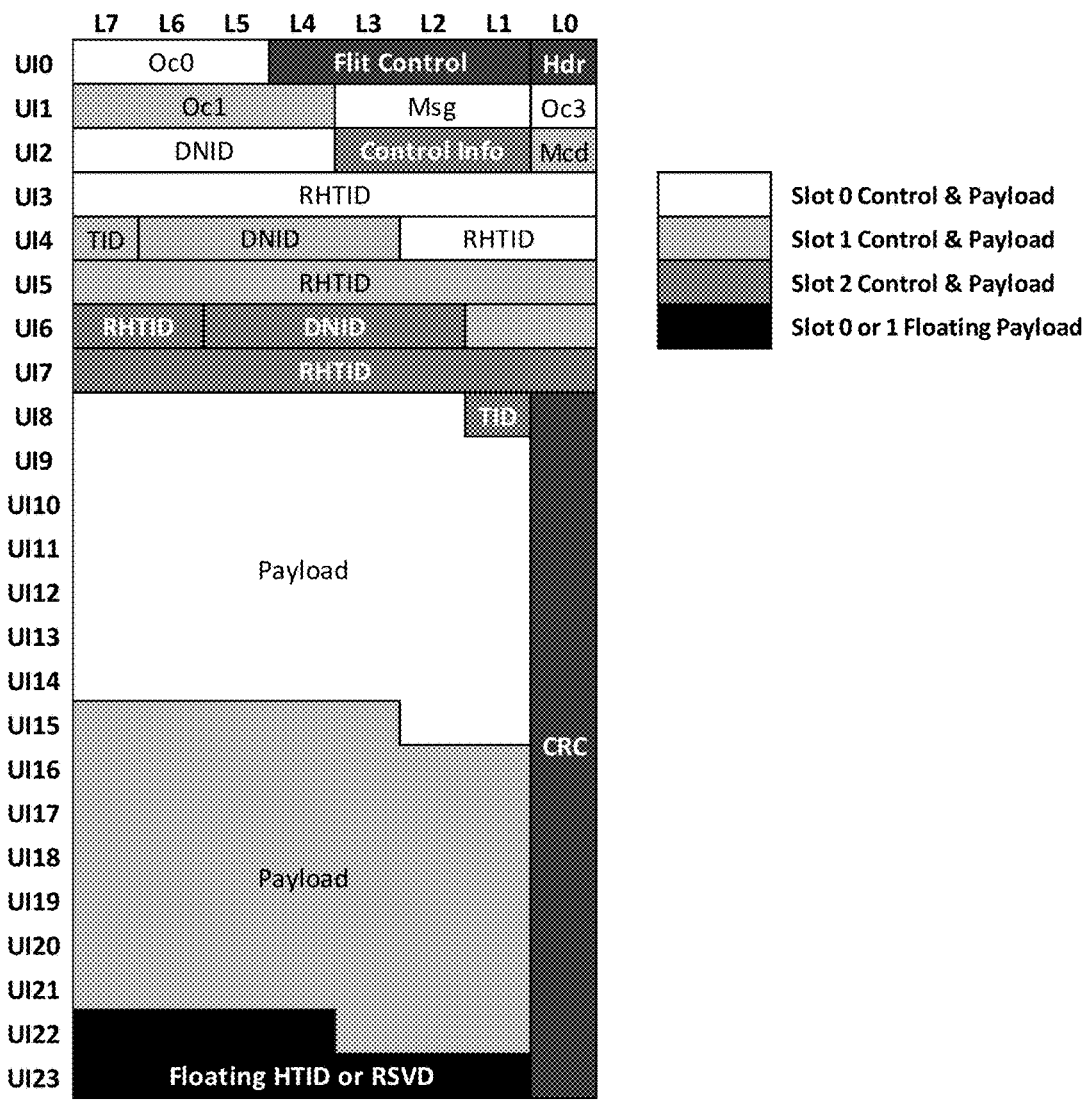
FIG. 6 illustrates a representation of an example multi-slot flit.

FIG. 6 illustrates a representation 600 of a generalized flit for an 8 lane link width. Each column of the representation 600 can symbolize a link lane and each row a respective UI. In some implementations, a single flit can be subdivided into two or more slots. Distinct messages or link layer headers can be included in each slot, allowing multiple distinct, and in some cases, independent messages corresponding to potentially different transactions to be sent in a single flit. Further, the multiple messages included in slots of a single flit may also be destined to different destination nodes, among other examples. For instance, the example of FIG. 6 illustrates a flit format with three slots. The shaded portions can represent the portion of the flit included in a respective slot.

In the example of FIG. 6, a "Hdr" field can be provided for the flit generally and represent a header indication for the flit. In some instances, the Hdr field can indicate whether the flit is a header flit or a data flit. In data flits, the flit can still remain slotted, but omit or replace the use of certain fields with payload data. In some cases, data fields may include an opcode and payload data. In the case of header flits, a variety of header fields can be provided. In the example of FIG. 6, "Oc" fields can be provided for each slot, the Oc field representing an opcode. Similarly, one or more slots can have a corresponding "msg" field representing a message type of the corresponding packet to be included in the slot, provided the slot is designed to handle such packet types, etc. "DNID" fields can represent a Destination Node ID, a "TID" field can represent a transaction ID, a "RHTID" field can represent either a requestor node ID or a home tracker ID, among other potential fields. Further, one or more slots can be provided with payload fields. Additionally, a CRC field can be included within a flit to provide a CRC value for the flit, among other examples.

In some implementations, link width can vary during the life of the link. For instance, the Physical layer can transition between link width states, such as to and from a full or original lane width and a different or partial lane width. For example, in some implementations, a link can be initialized to transfer data over 20 lanes. Later, the link can transition to a partial width transmitting state where only 8 lanes are actively used, among many other potential examples. Such lane width transitions can be utilized, for instance, in connection with power management tasks governed by one or more power control units (PCU) among other examples.

As noted above, link width can influence flit throughput rate. FIG. 7 is a representation of an example 192-bit flit sent over an 8 lane link, resulting in throughput of the flit at 24UI. Further, as shown in the example of FIG. 7, bits of the flit can be sent out of order in some instances, for example, to send more time-sensitive fields earlier in the transfer (e.g., flit type fields (e.g., data or header flit), opcodes, etc.), preserve or facilitate particular error detection or other functionality embodied in the flit, among other examples. For instance, in the example of FIG. 7, bits 191, 167, 143, 119, 95, 71, 47, and 23 are sent in parallel on lanes L7 through L9 during a first UI (i.e., UI0) of transfer, while bits 168, 144, 120, 96, 72, 48, 24, and 0 are sent during the 24$^{th}$ (or final) UI of the flit transfer (i.e., UI23). It should be appreciated that other ordering schemes, flit lengths, lane widths, etc. can be utilized in other implementations and examples.

Figure 9:
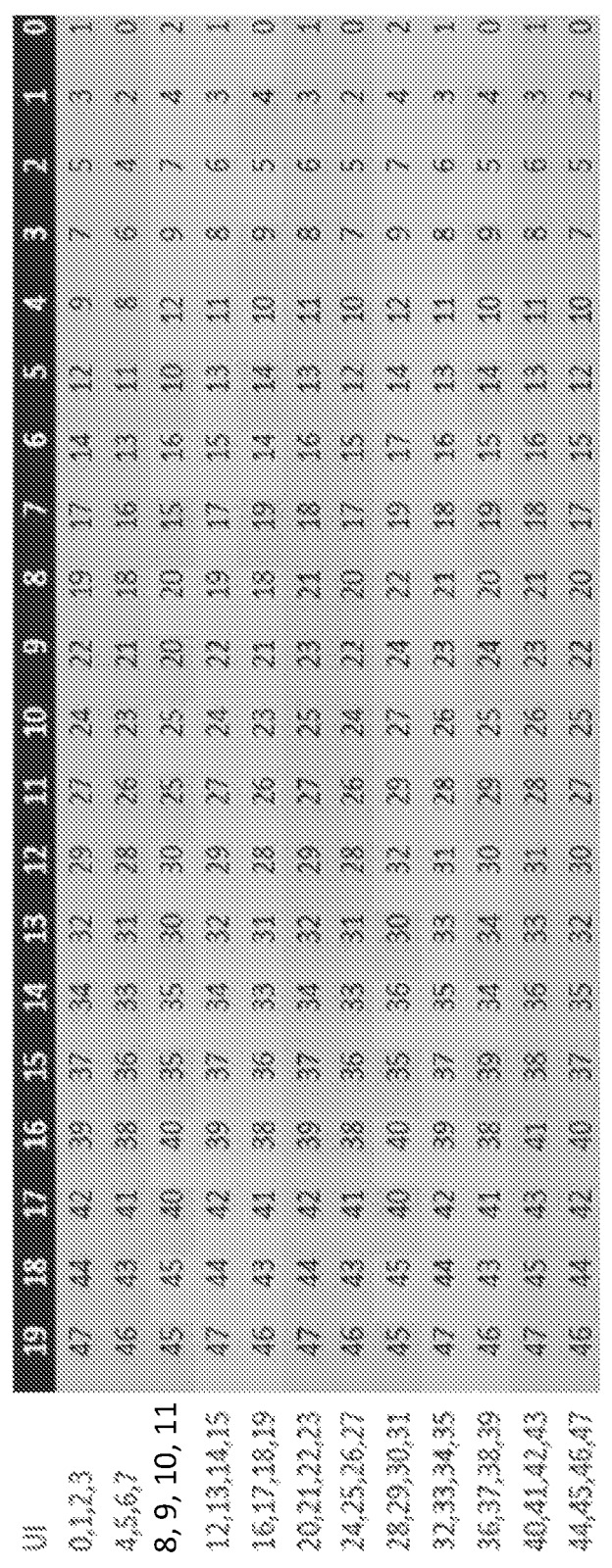

In some instances, the length of the flit can be a multiple of the number of active lanes. In such instances, the flit can be transmitted evenly on all active lanes and transfer of the flit can end substantially simultaneously at a clean (i.e., non-overlapping) boundary. For example, as shown in the representation of FIG. 8, bits of a flit can be considered to be transmitted in consecutive groupings of 4 bits, or "nibbles." In this example, a 192 bit flit is to be transferred over an 8 lane link. As 192 is a multiple of 8, the entire flit can be cleanly transferred over the 8 lane link in 24 UI. In other instances, the flit width may not be a multiple of the number of active lanes. For instance, FIG. 9 shows another representation of an example 192 bit transferred over 20 lanes. As 192 is not evenly divisible by 20, transfer of the full flit would require a non-integer number of intervals (e.g., 9.6 UI). In such cases, rather than wasting "extra" lanes not utilized during the 10th UI of transfer, a second overlapping flit can be transferred with the final bits of a preceding flit. Such overlapping, or swizzling, of the flits can result in jagged flit boundaries and flit bits sent out of order in some implementations. The pattern utilized for the transfer can be configured to allow more time-sensitive fields of the flit to be transferred earlier in the flit, preservation of error detection and correction, among other considerations. Logic can be provided in one or both of the Physical and Link layers to transfer flit bits according to such patterns and dynamically change between patterns based on the current link width. Further logic can be provided to re-order and re-construct flits from such swizzled or ordered bit streams, among other examples.

In some implementations, flits can be characterized as header flits (e.g., bearing packet header data) or data flits (e.g., bearing packet payload data). Returning to FIG. 6, a flit format can be defined that includes three (3) distinct slots (e.g., 0, 1, and 2), allowing up to three headers to be transferred in a single flit (e.g., one header in each slot). Accordingly, each slot can have both control fields and a payload field. In addition to these, payload fields can be defined for each header (and slot). Further, a floating payload field can be defined that can be flexibly used as extra payload length for two or more of the slots (e.g., by either slot 0 or slot 1), based on the header types in these slots.

In one embodiment, such as that illustrated in connection with FIG. 6, two slots, Slot 0 and 1, can be defined as having equally sized payload fields, while Slot 2 has a much smaller payload field for use by a particular subset of headers that lack the use of such larger payload fields, for instance. Further, in one example, Slot 1 and 2 control fields may not carry full Message Class encodings (unlike Slot 0), and Slot 2 may not carry a full opcode encoding, among other potential implementations.

As noted above, in some implementations, Slots 1 and 2 may not carry full Message Class encodings, as not all bits are utilized due to slotting restrictions. Slot 1 can carries a Message Class bit 0. Here, request (REQ) and snoop (SNP) packets are allowed. In this implementation, REQ and SNP Message Class encodings are differentiated by bit 0. As a result, if a designer wanted to allow different message classes in partial message class field, they could either select a different bit position (i.e. an upper bit that differentiates two different types of messages) or assign different message types to the lower order bit. However, here the upper two bits are implied as 0's with the lower bit distinguishing between a REQ and a SNP. In this example, Slot 2 carries no Message Class bits, as only response (RSP) (encoding 2) packets are allowed in. Therefore, the Message Class encoding for Slot 2 is a RSP-2. Slot 2 can also carry a partial opcode. As above, one or more of the opcode bits can be assumed to be 0. As a result, partial message class fields and partial operation code fields may be utilized that define a subset of messages and op codes that may be utilized. Note that multiple sets of opcodes and messages classes may be defined. Here, if a lower order bit of the message class is used, then a subset of message types (i.e. MSG type 1/MSG type 2) is available. However, if 2 bits are used, then a larger subset is provided (e.g. Message Type 1/Message Type 2/Message Type 3/Message Type 4), among other examples.

Message class encodings can correspond to particular header types to be included (or to utilize) one or more defined slots in a flit. For instance, a header may have multiple sizes. In one example, a three slot flit can be defined to support potentially four sizes of header, based on header type. Table 1 includes an exemplary listing of potential header formats and associated sizes:

TABLE 1

| Header Format | Header Size | Description |
| --- | --- | --- |
| SA | Single Slot | Request |
| SA-S | Single Slot | Snoops (incorporates floating payload field) |
| SA-D | Single Slot | Data header |
| SR-U | Small Slot | Completion without data |
| SR-O | Single Slot | Ordering |
| SR-C | Single Slot | Conflict resolution |
| SR-D | Single Slot | Data header |
| PW | Dual Slot | Partial write |
| PR | Dual Slot | Partial read |
| P2P | Dual Slot | Peer-to-peer |
| NCM | Dual Slot | Non-coherent messaging |
| Slot-NULL | Single Slot (or Opcode only) | Control flit |
| LLCRD | Small Slot | Control flit |
| LLCTRL | Full Flit | Control flit |

Small (or single) slot headers can be for those message small enough to fit in Slot 2, and that don't have protocol ordering requirements forcing them into Slot 0. A small slot header can also be placed in Slot 0, if the slotting restrictions for the flit call for it. The single slot header can be for those messages with payload that can fit in Slot 0 or Slot 1. Some single slot headers may also make use of the floating payload field. For instance, Standard Address Snoop (SA-S) Headers, in one embodiment, may not be sent in both slot 0 and slot 1 of the same flit in the example where only one HTID or floating field exists. Certain single slot headers may use Slot 0 based on protocol ordering requirements. The dual slot header can be for those messages large enough that they are to consume both the Slot 0 and Slot 1 payload fields, in addition to the floating payload field, among other examples.

A slot NULL opcode may include a special opcode, that can be used, in one example, in either Slot 0 or Slot 1. As an example, FIG. For Slot 0, Slot_NULL may be used when the link layer has no header to transmit in Slot 0, but it does have a header to transmit in Slot 1 or 2. When Slot_NULL is used in Slot 0, the Slot 0 payload is considered reserved (RSVD), among other examples. In some implementations, Slot_NULL can be utilized in Slot 1 potentially under two conditions. First, when Slot 0 is encoding a dual slot or special control header, and thus consuming the Slot 1 payload. In such instances, the Slot 1 opcode can be set to Slot_NULL. The second condition is when the link layer has nothing to send in Slot 1, but does have a valid Single Slot header for Slot 0 or Small Slot Header for Slot 2. Under this condition, the Slot 1 opcode can be set to Slot_NULL and the Slot 1 payload can be considered Reserved, among other potential examples.

In some implementations, the small Slot 2, may include a reduced number of opcode bits. When the link layer has nothing to send in Slot 2, it may send an "Implicit NULL" by encoding a specific opcode, such as a link layer credit opcode and setting the Slot 2 payload field to all zeros. The receiver of this Slot 2 encoding can process it as a link layer credit message (except in the case of the special control flits), but the all zeros encoding will have no effect on the Credit and Acknowledge state. In the case of special control flits, because they can consume the entire flit, the Slot 2 payload can be considered RSVD and the Implicit NULL will be ignored. Where the link layer has nothing to send in any of the three slots and the CRD/ACK fields, the link layer may transmit a special control null message, among other examples.

Slotting restrictions can be defined for one or more of the defined slots of a flit. In one embodiment, dual slot headers may only have their Message Class and Opcode placed in Slot 0. When Slot 0 contains a Dual Slot Header, Slot 1 may encode a Slot_NULL opcode, as the Slot 1 Payload field will be consumed by the Slot 0 header. When Slot 0 contains a Slot_NULL, single slot, or small slot header, Slots 1 and 2 may both encode a non-NULL header. Only small slot headers are allowed in Slot 2 in this particular example (e.g., illustrated in FIG. 6). When both Slot 0 and Slot 1 contain single slot headers, one may be of a type that consumes the floating payload field. If neither Slot 0 or Slot 1 contain a header type that consumes the floating payload field, the field may be considered RSVD.

Additionally, in some implementations, the Link layer can utilize multiple different types of virtual network or virtual channel credits. In one example, pooled virtual network adaptive (VNA) credits can be supported and a VNA field can be provided. In one example implementation, when the VNA field indicates a non-VNA flit (e.g., a flit that utilizes a different credit pool), the header may be designated to be placed in Slot 0. Further, the Slot 2 opcode may include a Slot_2 credit in this case. Further, when Slot 0 encodes a special control Header, both Slot 1 and Slot 2 control fields may be set to fixed values, and no headers may be placed in these slots, among other potential implementations.

As noted above, in header flits, a variety of different fields can be provided to be incorporated in corresponding flit slots, such as illustrated in the particular example of FIG. 6. Note that the fields illustrated and described a provided by way of example and additional or substitute fields can also be incorporated. Indeed, some of the fields described may be optional and be omitted in some implementations, among other examples.

In one example, a message class (MC) field can be provided, as well as other fields. In some examples, the Protocol layer can use the Message Class field to define the Protocol Class which also acts as the Major Opcode field. The Link layer can use the Message Class field as part of the virtual channel (VC) definition. Some Protocol Classes/VC can use multiple Message Class encodings due to the number of opcodes that are to be encoded, among other examples. For instance, Requests (REQ), Snoops (SNP), Response (RSP), writeback, non-coherent bypass, and non-coherent standard types can be supported. If each type encoded sixteen operations, then there would be an opcode space of 96 operations. And if another mode bit or other opcode space was defined for each type, then another 96 operations could be provided; and so on.

In one example, an Opcode field can additionally be provided. The Protocol layer may use the opcode in conjunction with the Message Class to form a complete opcode (i.e. define the message class type and the operation within). As an example, the same opcode with a REQ message type may define a first request operation, while the same opcode with a SNP message class may define a second, different SNP operation, among other examples. The Link Layer may use the opcode to distinguish, for instance, between a Home Agent target or a Caching Agent target for packets when a Home Agent and a Caching Agent share the same NodeID. Additionally, the Link Layer may also use the opcode to determine packet size, among other potential uses.

As noted above, flit headers can further include a Virtual network Adaptive (VNA) field. In one example, when a VNA field is set to a first value, the field can indicate that the flit is using VNA credits. When set to a second value, the flit is using VN0 or VN1 credits, among other potential implementations. In one embodiment, a value may indicate the flit is a single slot flit and slots 1 and 2 codes can be defined as NULL.

A Virtual Network (VN) field can also be provided and indicate for a flit if the header(s) in the flit are utilizing a particular virtual network, such as a virtual network VN0 or VN1. This may be used for both crediting purposes and to indicate which virtual network a message should drain to if using VNA. If one VN bit is provided for the entire flit, any VNA flit that contains multiple headers can ensure that all of them are draining to VN0 or all of them are draining to VN1. Alternatively, multiple VN bits may be provided. For non VNA flits, only Slot 0 may be allowed to have a non-control opcode, so the VN may indicate that header's network.

In some implementations, slots in a flit can be used for small payload messages such as credit returns, ACKs, NAKs, among others. In one example, a channel field can be provided that can be encoded for use in credit returns. This encoding, in combination with the Virtual Network field, may provide the Virtual Channel that a credit return maps to. Where a Message Class has multiple encodings, they may all map to a single Channel value for crediting. When the credit return type is VNA, the Channel value can be ignored. Use of RSVD encodings may be treated as an error by the receiving component. Table 2 includes examples of different Channel options that can be encoded. Note that any combination of bits (or bits representing a hexidecimal value) may be utilized. As an example, a lower order of 3 bits can be used for encoding.

TABLE 2

| Channel |
| --- |
| REQ: Request |
| SNP: Snoop |
| RSP: Response |
| RSVD: Reserved |
| WB: Write back |
| NCB: Non-coherent Bypass |
| NCS: Non-coherent Standard |

Acknowledgement, or ACK, fields can also be provided as header fields to be included in a flit slot. An ACK field may be used by the Link layer to communicate from a receiver to a sender error free receipt of flits. ACK having a first value indicates that a number of flits, such as 4, 8, or 12, have been received without error. When a sender receives an ACK it may deallocate the corresponding flits from the Link Layer Retry Queue. Ack and Ack fields can be used in credit return control flits (e.g., LLCRD), with the total number of Acknowledges being returned determined by creating the full acknowledge return value (Acknowledge first portion, ACK, Acknowledge second portion), among other examples.

As noted above, a Header indication bit (Hdr) can also be provided in some implementations and can be used for one or more purposes. For instance, a Hdr packet can identify whether the packet is a header or data flit, can indicate that the flit is the start of a new packet, as well as indicate the start of an interleaved Link Layer Control flit. The Hdr can be set for the first flit of all packets.

As noted above, in some implementations, special flit types can be provided, such as Link layer control flit. Such control flits can still utilize the defined multi-slot format defined for a slot while utilizing special header types corresponding to the control and error management functionality to be facilitated using such control flits. For example, a special header types can be provided that consume the entire flit and are used for communication between connected Link layers.

In one implementations, special control messages can be placed under a single Message class plus Opcode encoding for Link layer control messaging. This opcode can be designated "LLCTRL" and all control message types can fall under this sub-type of opcode. This can, in some implementations, allow the number of Message class bits to be included in a multi-slot flit format to be reduced (e.g., from four message class bits to three, etc.). In some implementations, another form of Link layer control flit can also be provided to handle a subset of the control messages. For instance, a LLCRD opcode can be defined for acknowledgement and credit returns, among other examples. In the case of LLCTRL opcodes, a multi-slot flit, rather than permitting use of each of the multiple slots, can dedicate the entire flit payload to the control message and permit special encodings for link-to-link communications.

A variety of control flits can be defined (e.g., under LLCTRL). In one example, some implementations of an HPI interconnect can include transmission of Viral status in protocol level messages and Poison status in data flits. In one embodiment, HPI protocol level messages and Poison status can be moved to control flits. Since these bits are infrequently used (e.g., only in the case of errors), removing them from the protocol level messages potentially increases flit utilization. Injecting them using control flits can still allow containment of the errors.

Viral alerts can include an error containment mechanism that results from a fatal error where it is difficult to avoid error propagation without immediately shutting down the system or suffering data corruption. Viral alert can address the error propagation issue relating to fatal errors, allowing an infected system to be shutdown gracefully and in the process cleaning up the system interface and other shared resources across system partitions.

Viral alerts can be implemented according to an assumption that the HPI interface is operational and can be used to deliver the error indication. In HPI, a viral alert can be issued using a special Viral Error control flit. When an agent becomes viral, it will preempt outbound flits and send a Viral Flit to the remote agent. Each protocol agent that detects a fatal error or receives a packet indicating a viral condition, can transition to a viral condition. Once a viral condition is set, the condition can last until the agent is reset (a system reset) or some other platform specific mechanism is used to clear out the viral condition. Once an agent becomes viral, then it is assumed that all future packets from that agent are compromised until the platform can determine the severity of the error. The platform can be responsible for controlling the system so that masking viral propagation or clearing of the viral state does not compromise error containment. For instance, I/O proxy entities may stop committing any data to permanent storage or I/O devices after they have become viral. Additionally, agent(s) that are in viral state may generate new requests to allow error handling software to gracefully shutdown the system partition. The mechanisms used by a system for graceful shutdown can be platform implementation specific and outside the scope of this specification.

Figure 10:
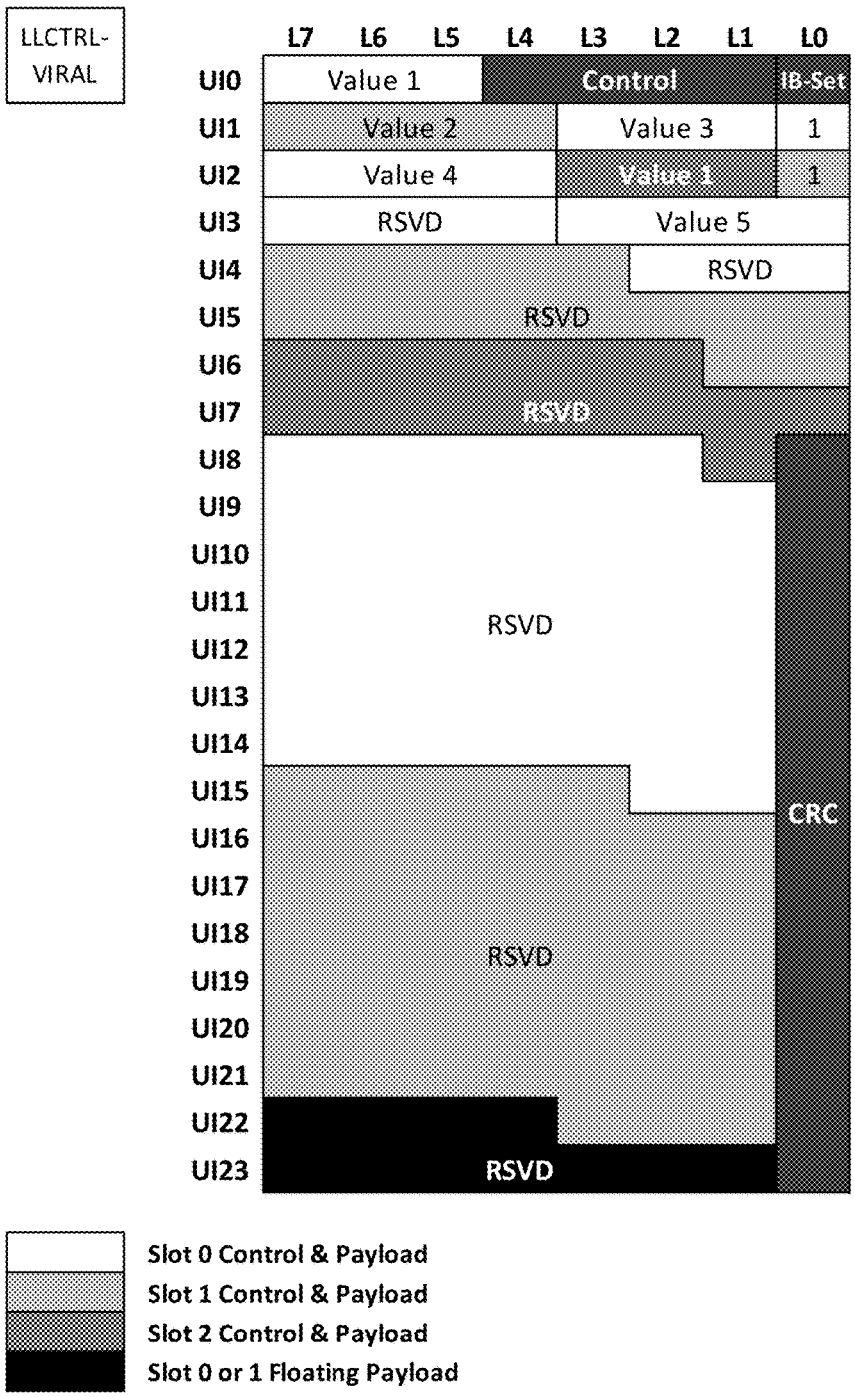
FIG. 10 illustrates a representation of an example viral error control flit.

The Viral Alert mechanism can be a global status per partition and may be cleared on all reset events including warm reset and cold reset. Under Viral Alert, other outbound flits are preempted with the sending of a Viral Error control flit. FIG. 10 illustrates a representation of an example of a special Viral Error control flit 1005 on an 8 lane link. As shown in this particular example, the general multi-slot format of a flit is maintained. However, in this example, Slot 0's message header fields are utilized to communicate the viral condition. The remaining slots can be Slot_NULL as well as the payloads (e.g., interpreted as being RSVD).

Link layer logic, in some implementations, can be configured to restrict Viral Error control flits from being included in and entering a Link Layer Retry Queue. Indeed, special control flits can be identified and handled differently than other flits so that the flit takes priority. Further, the structure of the special flit can be simplified, as in the example of FIG. 10, to make processing of the control flit more efficient. As an example, to ensure that a Viral state is not lost in the event of an error on a Viral Error flit, for instance, a Viral state can also be carried in a LLCTRL-RETRY.Ack message, among other features and examples.

Figure 11:
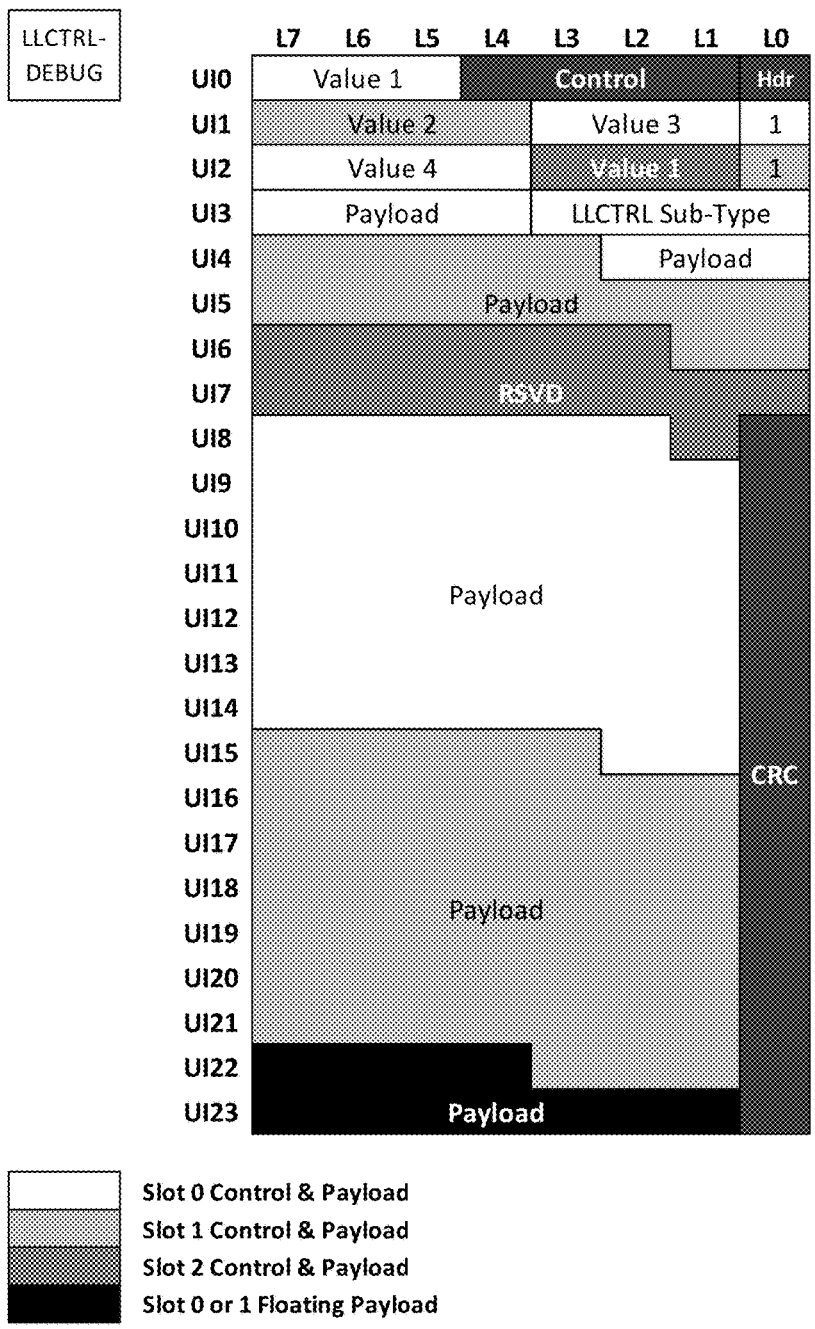
FIG. 11 illustrates a representation of an example multi-layer flit including a debug message.

In one embodiment, the Link Layer can additionally define three Special Debug message types. A second number of Standard Debug Message types may be reserved for future general debug packet type extensions. Support of Debug message types can be implementation or device specific. In one example, LLCTRL-DEBUG flits may be sent by the Link Layer when an enable debug control field is set. When this bit is not set, LLCTRL-DEBUG flits may not be transmitted on the link. Debug Packets may be important to expose internal states of devices connected by HPI that are otherwise inaccessible. The contents of debug packets can also be implementation specific. Contents could include things like branch info (source and target IPs), time-stamps, indication of an internal event trigger, and so on. The exposed data can be, for instance, by monitoring devices such as logic analyzers for post-processing and failure analysis. An example flit encoding of a Debug message type is illustrated in FIG. 11.

HPI can further support including communication of poison errors using special flits. For instance, a special Poison Error control flit, such as the one (e.g., 1205) illustrated in the example of FIG. 12, can be used to inject poison into the data payload of a data packet and indicate that previously-transmitted data has been determined to be corrupted or otherwise possess errors. In some instances, a Poison Error control flit can apply to an immediately preceding flit on the same link. A special Poison Error control flit can be retry-able, to guarantee that poison information is not lost in the event of a link error. When data is to be poisoned, the Link layer control Poison Error flit is interleaved between the first and second data flits of a packet if the first 32 bytes need to be poisoned. If the second 32 bytes need to be poisoned, the Poison Error flit is interleaved between the second and third data flits, and so on.

Figure 12:
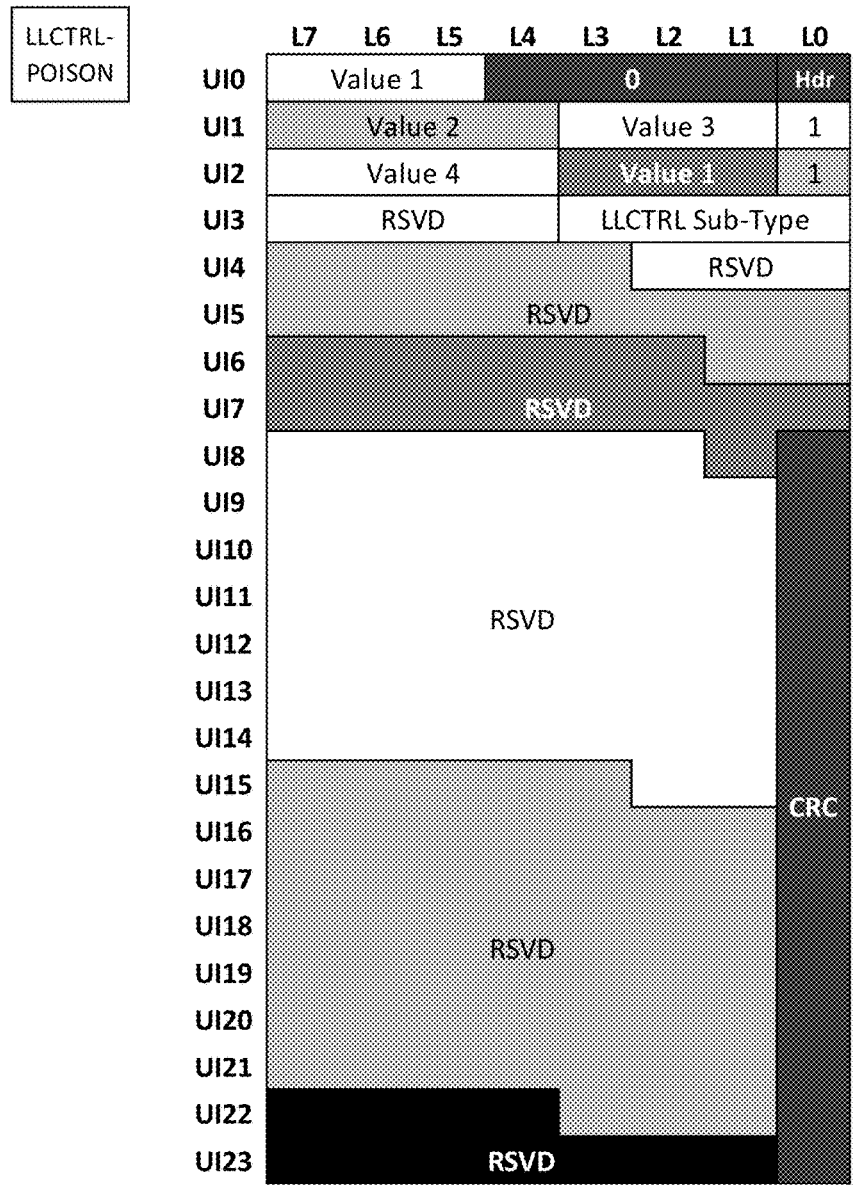
FIG. 12 illustrates a representation of an example poison error control flit.

In the particular example of FIG. 12, a Poison Error flit 1205 can encode the poison condition in the opcode of Slot 0, with the remaining slots (and corresponding fields) encoded with Slot_NULL. Further, as in the example of the Viral Error control flit, payload fields can be zeroed or null and be regarded as RSVD fields.

Small slot fields can be utilized in some link layer control messages. For instance, credit (CRD) and acknowledge (ACK) bits can be included in small slots of a flit to allow return of a pre-mapped number of credits, such as eight, or number of ACKs, such as 8, among many other examples. In some implementations, credit and acknowledge fields can be fully encoded so as to designate any denomination of credits or acknowledges. As an example, in a fully encoded credit fields, bits can be utilized as Credit[n] and Acknowledge[n] when a slot is encoded to indicate that it includes a link-layer credit (LLCRD) message. In some instances, full encoding credit return fields can potentially improve efficiency by allowing any flit to return the number of credits and the number of Acknowledges using a total of only 2 bits, but also allowing their definitions to remain consistent when a fully encoded LLCRD return is used.

In one example, for flow control, credit/acknowledge information can flow as part of non-LLCTRL messages. For instance, in one implementations, HPI can provide that every header flit includes single bit fields serving as a mechanism for bulk credit returns or bulk acknowledges. For instance, setting such fields to a "1" can indicates a refund of 8 VNA credits (in the case of the CRD field) or 8 ACKs (in the case of the ACK field). This can allows credit refunds on any header flit being sent (with the exception, in some implementations, of LLCTRL messages).

On other hand, to address credit/acknowledgement return increments other than some bulk or pre-defined quantity (e.g., 8), and to deal with the inefficiencies that can be introduced through a limited set of return increments, an LLCRD opcode can be provided. The LLCRD opcode can utilize and encode the smallest slot in a header flit (e.g., Slot 2) to communicate credit and ACK returns in one or more formats. For instance, in one example, a first format can be provided that allows a return of any quantity (e.g., from 0-7) of VN0 or VN1 credits for a single message class, and any quantity of ACKs (e.g., from 0-255) through bits dedicated for VN0/1 credit returns (e.g., 3 bits), other bits dedicated for ACK return (e.g., 7 bits), and utilizing the header flit's "ACK" bit as Acknowledge[2] to construct, for instance, an 8 bit field. A second format can be provided that allows return of any quantity (e.g., from 0-255) of VNA credits and any quantity of ACKs (e.g., from 0-255) through dedicated bits (e.g., 7 bits) for VNA returns, and utilizing the header flit's "CRD" bit as Credit[2], to construct, for instance, an 8 bit field. Likewise, dedicated bits (e.g., 7 bits) can be provided for ACK returns, and the header flit's "ACK" bit can be utilized to construct, for instance, an 8 bit field. These large, fully encoded, fields can allow the transmitter to refund all credits or acknowledges that have been accumulated (e.g., buffered) in a single message. This can simplify the accumulated credit count logic, in some implementations, to a simple "clear", rather than, for instance, a decrementer on the accumulator.

Figure 13:
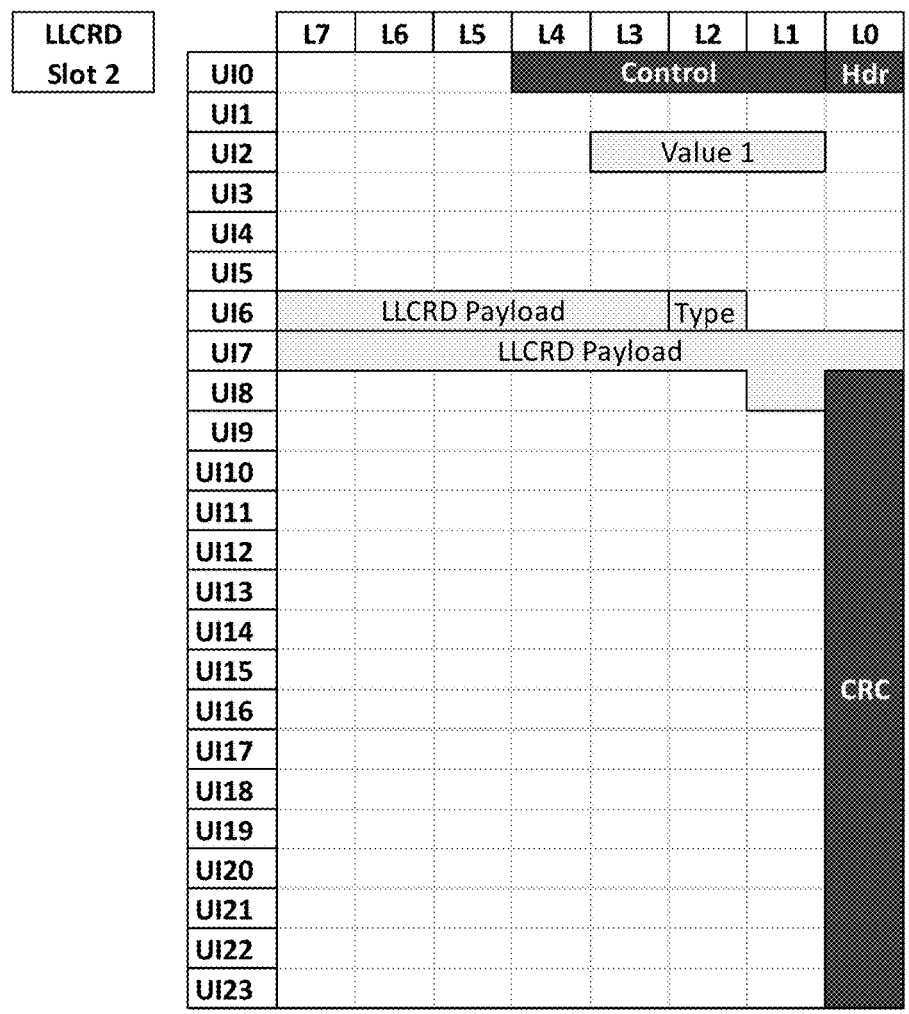
FIG. 13 illustrates a representation of an example slot message for returning credits and acknowledgements.

In one particular example illustrated in FIG. 13, a flit with a format such as that defined in the example of FIG. 6, can be utilized to support a LLCRD message. For instance, in this particular example, a LLCRD message may be used in Slot 2 with a pre-designated opcode to return VN0, VN1, and VNA credits, as well as ACKs for the Link Layer Retry Queue. A Link Layer Credits (LLCRD) field (e.g., included in "Value 1") can indicates the format for the LLCRD payload field (e.g., the examples of FIG. 14 below, among other potential field formats).

Figure 14:
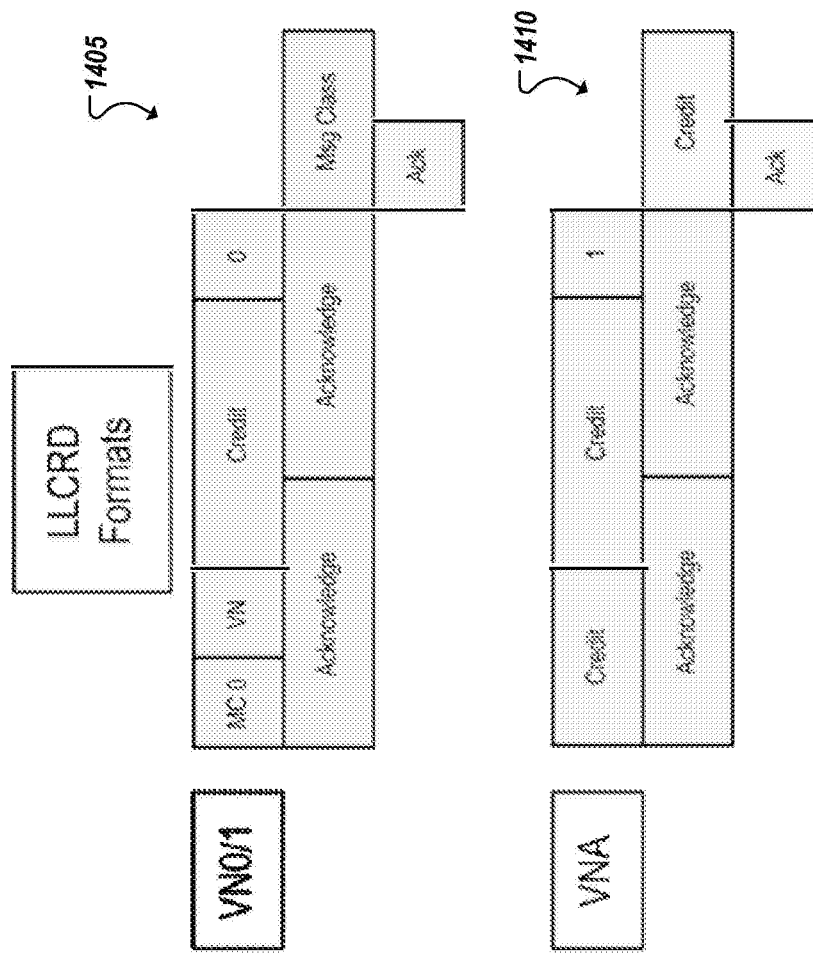
FIG. 14 illustrates credit return formats for use in the example slot of FIG. 13.

FIG. 13 shows a generic format for the slot in LLCRD messaging. FIG. 14 illustrates formats for two different LLCRD credit refund messages 1405, 1410 that can be supported in Slot 2. For instance, LLCRD format headers can be provided for both VN0/1 credit returns (e.g., 1405) and VNA credit returns (e.g., 1410). A Credit Return (CRD) field can be used to refund VNA credits across the link. When set to a first value, this field indicates refund of a number of VNA credits, such as 4, 8, or 12. A Credit and Credit Return (CRDCRC) field can also be provided and may be used in LLCRD format headers, for both VN credit returns and VNA returns. In a VN LLCRD return format, the credit portion may indicate the total number of credits returned for the Virtual Network and Message class. In a VNA LLCRD return format, the total number of VNA credits being returned may be determined by creating the full VNA return value (e.g. a portion of the credit, CRD, and a second portion of the credit.

In one particular example, such as in the examples of FIG. 14, in a VN0/1 LLCRD return format (e.g., 1405), Credit [N:0] indicates the total number of credits returned for the Virtual Network and Message class. In a VNA LLCRD return format (e.g., 1410), the total number of VNA credits being returned is determined by creating the Full_VNA[A:0] return value, where Full_VNA[A:0]={Credit[A:B], CRD, Credit[C:0]}. In some instances, a CRD field can also be used to refund VNA credits across the link. When set to 1, this field indicates refund of 8 VNA credits. When Slot 2 is encoding a VNA LLCRD return type, the total number of VNA credits returned is as described below.

In some implementations of Link layer credit returns, a Channel field can be used to encode the channel for use in credit returns. This encoding, in combination with the Virtual Network field, can be used to identify the Virtual Channel that a credit return maps to. Where a Message Class has multiple encodings, they will all map to a single Channel value for crediting. When the credit return type is VNA, the Channel value can be ignored.

As shown in the examples of FIG. 14, ACK fields can also be included along with credit return fields in the Link layer message. An ACK field may be used by the Link layer to communicate from a receiver to a sender error free receipt of flits. As an example, ACK=1 can indicate that a number of flits have been received without error. When a sender receives an ACK it can deallocate the corresponding flits from the Link Layer Retry Queue. In the examples of FIG. 14, Acknowledge [A:B] and Acknowledge [C:0] can be used to determine the total number of Acknowledges being returned by creating the Full Acknowledge[A:0] return value, where Full Acknowledge[A:0]={Acknowledge[A:B], ACK, Acknowledge[C:0]}.

In some implementations, some fields may be defined to only allow returns in certain predefined increments. For instance, in one example, increments can be defined of 1 (for VN0/1), 2/8/16 (for VNA), and 8 (for Acknowledge), among other examples. This means that returning a large number of pending Credits or Acknowledges may use multiple return messages. It also means that odd numbered return values for VNA and Acknowledge may be left stranded pending accumulation of an evenly divisible value. Some implementations of HPI may have fully encoded credit and ACK return fields, allowing an agent to return all accumulated credits or ACKs for a pool with a single message. This potentially improves link efficiency and also potentially simplifies logic implementation (return logic can implement a "clear" signal rather than a full decrementer).

In some implementations, credits for buffers in VN0 and VN1 can be returned on a per packet basis for each message class. Hence, each buffer for each credit in VN0/VN1 may be sized to cover the buffer requirements for the largest packet size that can use the credit. In some instances, this can provide the most efficient method of credit return for these channels.

In some implementations, because of the shared resource and a variety of message sizes that may be allocated/deallocated, it may not be efficient to use packet credit/debit for VNA. Instead, in some instances a flit credit/debit scheme can be used for VNA. Each flit can represents 1 flit of receiver buffer space with the credits shared by all message classes that can transmit on VNA. The encodings for the credit return can be described in relation to "LLCRD-Type." Further, as noted above, a flit sent using VNA may contain up to 3 headers (one per slot), in some implementations. The receiver may not return a VNA credit until all three slots have been freed from the receiver queue, among other potential conditions or implementations.

Figure 15:
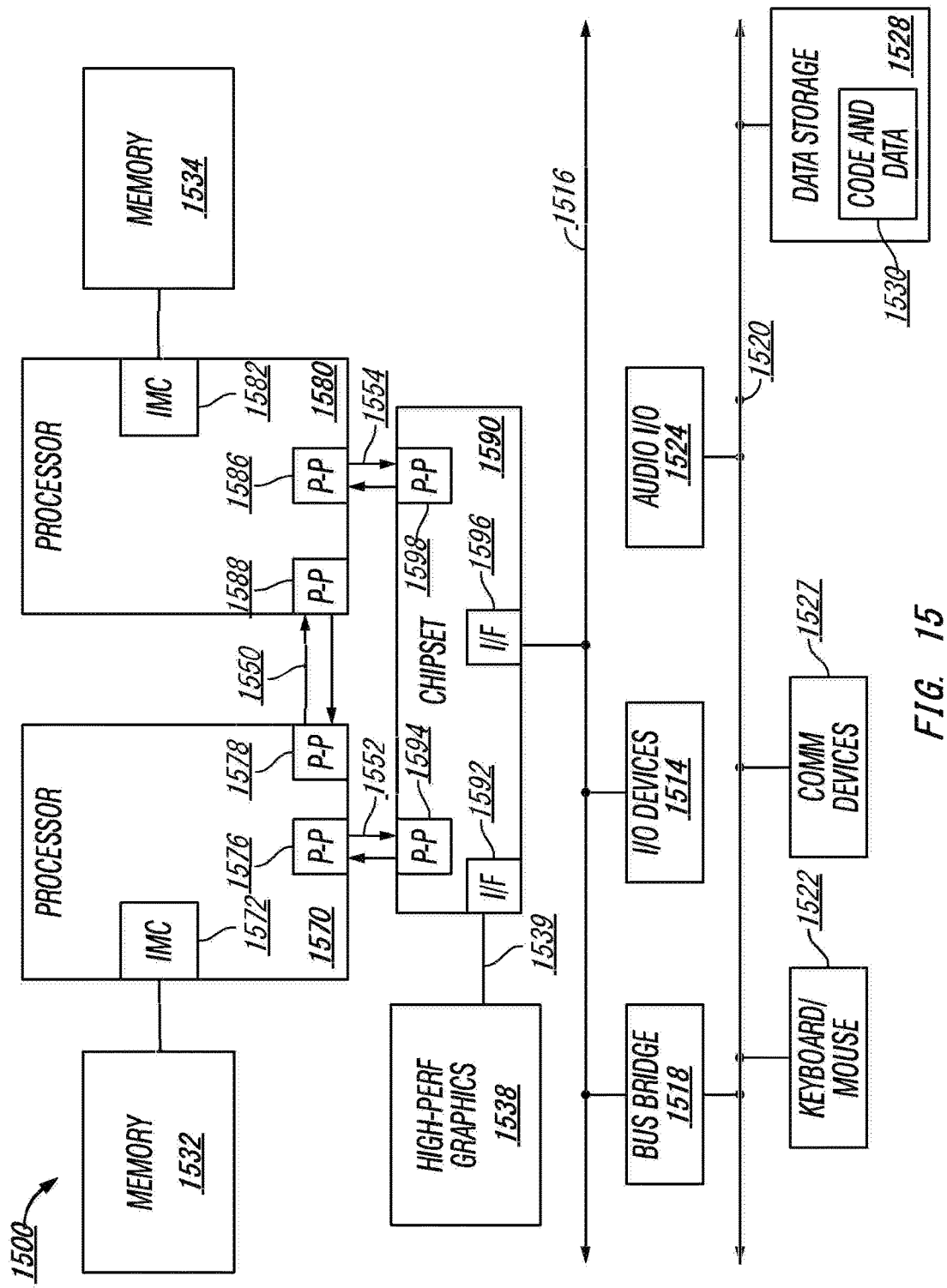
FIG. 15 illustrates an embodiment of a block for an example computing system.

HPI can incorporated in any variety of computing devices and systems, including mainframes, server systems, personal computers, mobile computers (such as tablets, smartphones, personal digital systems, etc.), smart appliances, gaming or entertainment consoles and set top boxes, among other examples. For instance, FIG. 15 illustrates an example computer system 1500 in accordance with some implementations. As shown in FIG. 15, multiprocessor system 1500 is a point-to-point interconnect system, and includes a first processor 1570 and a second processor 1580 coupled via a point-to-point interconnect 1550. Each of processors 1570 and 1580 may be some version of a processor. In one embodiment, 1552 and 1554 are part of a serial, point-to-point coherent interconnect fabric, such as a high-performance architecture. As a result, the invention may be implemented within the QPI architecture.

While shown with only two processors 1570, 1580, it is to be understood that the scope of the present invention is not so limited. In other embodiments, one or more additional processors may be present in a given processor.

Processors 1570 and 1580 are shown including integrated memory controller units 1572 and 1582, respectively. Processor 1570 also includes as part of its bus controller units point-to-point (P-P) interfaces 1576 and 1578; similarly, second processor 1580 includes P-P interfaces 1586 and 1588. Processors 1570, 1580 may exchange information via a point-to-point (P-P) interface 1550 using P-P interface circuits 1578, 1588. As shown in FIG. 15, IMCs 1572 and 1582 couple the processors to respective memories, namely a memory 1532 and a memory 1534, which may be portions of main memory locally attached to the respective processors.

Processors 1570, 1580 each exchange information with a chipset 1590 via individual P-P interfaces 1552, 1554 using point to point interface circuits 1576, 1594, 1586, 1598. Chipset 1590 also exchanges information with a high-performance graphics circuit 1538 via an interface circuit 1592 along a high-performance graphics interconnect 1539.

A shared cache (not shown) may be included in either processor or outside of both processors; yet connected with the processors via P-P interconnect, such that either or both processors' local cache information may be stored in the shared cache if a processor is placed into a low power mode.

Chipset 1590 may be coupled to a first bus 1516 via an interface 1596. In one embodiment, first bus 1516 may be a Peripheral Component Interconnect (PCI) bus, or a bus such as a PCI Express bus or another third generation I/O interconnect bus, although the scope of the present invention is not so limited.

As shown in FIG. 15, various I/O devices 1514 are coupled to first bus 1516, along with a bus bridge 1518 which couples first bus 1516 to a second bus 1520. In one embodiment, second bus 1520 includes a low pin count (LPC) bus. Various devices are coupled to second bus 1520 including, for example, a keyboard and/or mouse 1522, communication devices 1527 and a storage unit 1528 such as a disk drive or other mass storage device which often includes instructions/code and data 1530, in one embodiment. Further, an audio I/O 1524 is shown coupled to second bus 1520. Note that other architectures are possible, where the included components and interconnect architectures vary. For example, instead of the point-to-point architecture of FIG. 15, a system may implement a multi-drop bus or other such architecture.

While the present invention has been described with respect to a limited number of embodiments, those skilled in the art will appreciate numerous modifications and variations therefrom. It is intended that the appended claims cover all such modifications and variations as fall within the true spirit and scope of this present invention.

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present invention.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc, which are to be distinguished from the non-transitory mediums that may receive information there from.

Instructions used to program logic to perform embodiments of the invention may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

The following examples pertain to embodiments in accordance with this Specification. One or more embodiments may provide an apparatus, a system, a machine readable storage, a machine readable medium, and a method to generate a link layer control message to be included in a flit that is to be sent over a serial data link to a device, wherein flits sent over the data link are to include a plurality of slots; and send the flit with the link layer control message.

In at least one example, the I/O logic comprises a layered stack comprising physical layer logic, link layer logic, and protocol layer logic.

In at least one example, the control message is to be in encoded in a particular one of the slots and no other messages are to be included in the flit.

In at least one example, the other slots are to be encoded as null slots.

In at least one example, the control message is identifiable, at least in part, from an encoding of an opcode of the particular flit.

In at least one example, the control message comprises a viral alert message.

In at least one example, the control message comprises a poison alert message.

In at least one example, the control message is to include at least one of credit returns and acknowledgements.

In at least one example, the control message is to be encoded in a particular one of the plurality of slots, wherein the particular slot is the smallest of the plurality of slots.

In at least one example, the plurality of slots consist of three defined slots.

In at least one example, the particular slot is the third of the three slots, the first of the three slots comprises 72 bits, the second of the three slots comprises 70 bits, and the third slot comprises 18 bits.

In at least one example, the control message includes dedicated bits for virtual network credit returns and dedicated bits for acknowledgement returns.

In at least one example, the dedicated bits for credit returns comprise three bits adapted to be encoded with a credit return value between 0 and 7.

In at least one example, the dedicated bits for credit returns comprise seven bits adapted to be encoded with a credit return value between 0 and 255.

In at least one example, the credit returns comprises credit returns to a shared adaptive virtual network (VNA) credit pool.

One or more embodiments may provide an apparatus, a system, a machine readable storage, a machine readable medium, and a method to receive a flit over a serial data network, wherein flits are to include a plurality of slots, and identify a link layer control message from the flit.

In at least one example, the control message is encoded in a particular one of the slots and no other messages are included in the flit.

In at least one example, the control message comprises a viral alert message.

In at least one example, the control message comprises a poison alert message.

In at least one example, the control message is to include at least one of credit returns and acknowledgement returns.

In at least one example, the control message is to be encoded in a particular one of the plurality of slots, wherein the particular slot is the smallest of the plurality of slots.

In at least one example, the control message is of a format including dedicated bits for virtual network credit returns and dedicated bits for acknowledgement returns.

In at least one example, identifying the control message includes identifying a set of accumulated acknowledgements and the control message is to return the acknowledgements.

In at least one example, identifying the control message includes identifying a set of accumulated credits to be returned and the control message is to return the credits for a particular virtual network.

In at least one example, the control message can be communicated between a first and second device. The first and second devices can be microprocessors, graphics accelerators, or other devices.

One or more examples can further provide a layered protocol stack including at least a link layer and a physical layer, the layered protocol stack configured to be coupled to a serial, differential link, wherein the layered protocol stack is further configured to transmit a control flit including a poison status over the link.

In at least one example, the control flit includes link layer credit (LLCRD) message encoding.

In at least one example, the control flit includes link layer control (LLCTRL) message encoding.

In at least one example, the control flit includes a fully encoded credit return field.

One or more examples can further provide a layered protocol stack including at least a link layer and a physical layer, the layered protocol stack configured to be coupled to a serial, differential link, wherein the layered protocol stack is further configured to transmit a single flit including a combined credit and acknowledge to represent a first number of credits returned and a second number of acknowledges.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the invention as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
a processor; and
link layer logic comprising instructions executable by the processor to generate a flit comprising a link layer control message, wherein the flit has a flit format defining a plurality of slots within the flit, a first one of the plurality of slots is capable of being encoded with a first header, and a second one of the plurality of slots is capable of being encoded with a second header,
wherein the entire flit is used for the link layer control message and a first one of the plurality of slots is to be encoded with data to identify a type of the link layer control message.

2. The apparatus of claim 1, wherein the type of the link layer control message comprises a poison control message.

3. The apparatus of claim 1, wherein the type of the link layer control message comprises a viral control message.

4. The apparatus of claim 1, wherein the type of the link layer control message comprises a debug control message.

5. The apparatus of claim 1, wherein the plurality of slots comprise three slots.

6. The apparatus of claim 5, wherein a third one of the three slots is capable of being encoded with a third header.

7. The apparatus of claim 5, wherein the first slot comprises at least 72 bits, the second slot comprises at least 70 bits, and the third slot comprises at least 18 bits.

8. The apparatus of claim 7, wherein the flit comprises a cyclic redundancy check (CRC) field.

9. The apparatus of claim 8, wherein the CRC field comprises 16 bits.

10. The apparatus of claim 7, wherein the flit comprises 192 bits.

11. A processor device comprising:
physical layer logic to receive a plurality of physical layer units of transfer (phits); and
link layer logic to identify a link layer flow control unit (flit) transmitted through the plurality of phits, comprising a link layer control message,
wherein the flit has a flit format defining a plurality of slots within the flit, each of the plurality of slots is capable of being encoded with a distinct header, the entire flit is used for the link layer control message, and a first one of the plurality of slots is encoded with a link layer control header to identify a type of the link layer control message.

12. The processor device of claim 11, further comprising a processor node.

13. The processor device of claim 11, wherein the plurality of slots comprise three slots.

14. The processor device of claim 13, wherein each of the three slots is capable of being encoded with a distinct header.

15. The processor device of claim 11, wherein the type of the link layer control message is one of a plurality of types defined in a protocol.

16. The processor device of claim 15, wherein the protocol comprises a cache coherent multi-layer protocol.

17. The processor device of claim 15, wherein the plurality of types comprise viral control messages, debug control messages, and poison control messages.

18. An apparatus comprising:
a controller associated with a first processor, wherein the controller is to interface between the first processor to recognize a first instruction set and a second processor to recognize a second instruction set that is different from the first instruction set, the controller comprising protocol layer logic, link layer logic, and physical layer logic, wherein the link layer logic is to:
generate a flit comprising a link layer control message, wherein the flit has a flit format defining a plurality of slots within the flit, a first one of the plurality of slots is capable of being encoded with a first header, and a second one of the plurality of slots is capable of being encoded with a second header,
wherein the entire flit is used for the link layer control message and a first one of the plurality of slots is to be encoded with data to identify a type of the link layer control message.

19. The apparatus of claim 18, wherein the first slot is to be encoded with the data to identify the type of the link layer control message.

20. The apparatus of claim 18, wherein the type of the link layer control message is one of a plurality of types.

21. The apparatus of claim 20, wherein the plurality of types comprise viral control messages, debug control messages, and poison control messages.

22. A system comprising:
a first processor device; and
a second processor device coupled to the first device using a serial data link, wherein the second processor device comprises:
link layer logic executable to generate a link layer flow control unit (flit) comprising a link layer control message, the flit has a flit format comprising a plurality of slots within the flit, a first one of the plurality of slots is capable of being encoded with a first header, a second one of the plurality of slots is capable of being encoded with a second header, the entire flit is used for the link layer control message, and a first one of the plurality of slots is encoded to identify a type of the link layer control message; and
physical layer logic to send the flit to the first processor device.

23. The system of claim 22, wherein the physical layer logic and link layer logic are according to a defined cache-coherent multi-layer protocol.

24. The system of claim 23, wherein the first processor device comprises physical layer logic and link layer logic according to the cache-coherent multi-layer protocol.

* * * * *